US012074128B2

(12) United States Patent
Choi et al.

(10) Patent No.: US 12,074,128 B2
(45) Date of Patent: Aug. 27, 2024

(54) THREE-DIMENSIONAL SEMICONDUCTOR MEMORY DEVICE AND ELECTRONIC SYSTEM INCLUDING THE SAME

(71) Applicant: SAMSUNG ELECTRONICS CO., LTD., Suwon-si (KR)

(72) Inventors: Moorym Choi, Yongin-si (KR); Yoonjo Hwang, Gimpo-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 433 days.

(21) Appl. No.: 17/545,117

(22) Filed: Dec. 8, 2021

(65) Prior Publication Data

US 2022/0375888 A1 Nov. 24, 2022

(30) Foreign Application Priority Data

May 20, 2021 (KR) .................. 10-2021-0065032

(51) Int. Cl.
| | | |
|---|---|---|
| H01L 23/00 | (2006.01) | |
| H01L 23/535 | (2006.01) | |
| H01L 25/065 | (2023.01) | |
| H01L 25/18 | (2023.01) | |

(Continued)

(52) U.S. Cl.
CPC ............ H01L 24/08 (2013.01); H01L 23/535 (2013.01); H01L 25/0657 (2013.01);
(Continued)

(58) Field of Classification Search
CPC ... H01L 24/08; H01L 23/535; H01L 25/0657; H01L 25/18; H01L 2224/08145;
(Continued)

(56) References Cited

U.S. PATENT DOCUMENTS

| 8,971,118 B2 | 3/2015 | Jin et al. |
| 9,570,463 B1 | 2/2017 | Zhang et al. |

(Continued)

FOREIGN PATENT DOCUMENTS

| CN | 110720143 A | 1/2020 |
| CN | 111033739 A | 4/2020 |

(Continued)

*Primary Examiner* — Mohammad A Rahman
(74) *Attorney, Agent, or Firm* — Muir Patent Law, PLLC

(57) ABSTRACT

A three-dimensional semiconductor memory device includes a first substrate, a peripheral circuit structure on the first substrate, a cell array structure on the peripheral circuit structure, the cell array structure including a stack structure having alternating interlayer dielectric layers and gate electrodes, a first insulating layer covering the stack structure, and a second substrate on the stack structure and the first insulating layer, the stack structure being between a bottom surface of the second substrate and the peripheral circuit structure, a second insulating layer on the cell array structure, a first penetration contact penetrating the first insulating layer, the second substrate, and the second insulating layer, and a second penetration contact penetrating the first insulating layer and the second insulating layer, the second penetration contact being spaced apart from the second substrate, and the first and second penetration contacts having widths decreasing with increasing distance from the first substrate.

20 Claims, 21 Drawing Sheets

(51) Int. Cl.
*H10B 41/27* (2023.01)
*H10B 41/41* (2023.01)
*H10B 43/27* (2023.01)
*H10B 43/40* (2023.01)

(52) U.S. Cl.
CPC ............. *H01L 25/18* (2013.01); *H10B 41/27* (2023.02); *H10B 41/41* (2023.02); *H10B 43/27* (2023.02); *H10B 43/40* (2023.02); *H01L 2224/08145* (2013.01); *H01L 2924/1431* (2013.01); *H01L 2924/14511* (2013.01)

(58) Field of Classification Search
CPC ... H01L 2924/1431; H01L 2924/14511; H01L 21/823475; H01L 2225/06544; H10B 41/27; H10B 41/41; H10B 43/27; H10B 43/40; H10B 43/50; H10B 43/20
See application file for complete search history.

(56) References Cited

U.S. PATENT DOCUMENTS

| | | | |
|---|---|---|---|
| 10,354,980 | B1 | 7/2019 | Mushiga et al. |
| 10,756,104 | B2 | 8/2020 | Fujiki et al. |
| 2019/0288003 | A1 | 9/2019 | Shim et al. |
| 2019/0312051 | A1* | 10/2019 | Park ................ H10B 43/10 |
| 2020/0350320 | A1 | 11/2020 | Cheng et al. |
| 2021/0134778 | A1 | 5/2021 | Huang et al. |
| 2021/0375912 | A1 | 12/2021 | Zhang et al. |

FOREIGN PATENT DOCUMENTS

| | | |
|---|---|---|
| CN | 111739891 A | 10/2020 |
| CN | 111801798 A | 10/2020 |
| CN | 112185981 A | 1/2021 |

* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATION

This U.S. non-provisional patent application claims priority under 35 U.S.C. § 119 to Korean Patent Application No. 10-2021-0065032, filed on May 20, 2021, in the Korean Intellectual Property Office, the entire contents of which are hereby incorporated by reference.

BACKGROUND

1. Field

The present disclosure relates to a three-dimensional semiconductor memory device, a method of fabricating the same, and an electronic system including the same. In particular, the present disclosure relates a three-dimensional semiconductor memory device, which includes a peripheral circuit structure and a cell array structure that are bonded to each other through bonding pads, a method of fabricating the same, and an electronic system including the same.

2. Description of the Related Art

A semiconductor device capable of storing a large amount of data is required as a part of an electronic system. Higher integration of semiconductor devices is required to satisfy consumer demands for large data storing capacity, superior performance, and inexpensive prices. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

According to an embodiment, a three-dimensional semiconductor memory device may include a first substrate, a peripheral circuit structure on the first substrate, a cell array structure including a stack structure, a first insulating layer covering the stack structure, and a second substrate on the stack structure and the first insulating layer, the stack structure including interlayer dielectric layers and gate electrodes, which are alternately and repeatedly stacked on the peripheral circuit structure, a second insulating layer on the cell array structure, a first penetration contact penetrating the first insulating layer, the second substrate, and the second insulating layer, and a second penetration contact provided to penetrate the first insulating layer and the second insulating layer and spaced apart from the second substrate. The stack structure may be located between a bottom surface of the second substrate and the peripheral circuit structure, and the first and second penetration contacts may have widths decreasing with increasing distance from the first substrate.

According to an embodiment, a three-dimensional semiconductor memory device may include a first substrate, a peripheral circuit structure on the first substrate, a cell array structure on the peripheral circuit structure, a first insulating layer on the cell array structure, and a first penetration contact and a second penetration contact penetrating the cell array structure and the first insulating layer. The peripheral circuit structure may include peripheral transistors on the first substrate, peripheral circuit interconnection lines on the peripheral transistors, and first bonding pads connected to the peripheral transistors through the peripheral circuit interconnection lines. The cell array structure may include second bonding pads each of which is integrally bonded to each of the first bonding pads of the peripheral circuit structure, connection circuit interconnection lines on the second bonding pads, bit lines connected to the second bonding pads through the connection circuit interconnection lines, a stack structure including interlayer dielectric layers and gate electrodes, which are alternately and repeatedly stacked on the bit lines, a second insulating layer covering the stack structure, vertical channel structures provided to penetrate the stack structure and connected to the bit lines, and a second substrate provided on the stack structure and the second insulating layer to be in contact with a top surface of each of the vertical channel structures. The stack structure may be located between a bottom surface of the second substrate and the peripheral circuit structure, and the vertical channel structures may be provided in vertical channel holes penetrating the stack structure. Each of the vertical channel structures may include a data storage pattern, which conformally covers an inner side surface of each of the vertical channel holes, and a vertical semiconductor pattern, which is enclosed by the data storage pattern. The data storage pattern may include a blocking insulating layer, a charge storing layer, and a tunneling insulating layer, which are sequentially stacked. The first penetration contact may be provided to penetrate the second substrate, and the second penetration contact may be spaced apart from the second substrate. The first and second penetration contacts may have widths decreasing with increasing distance from the first substrate.

According to an embodiment, an electronic system may include a three-dimensional semiconductor memory device including a first substrate, a peripheral circuit structure on the first substrate, a cell array structure on the peripheral circuit structure, a first insulating layer on the cell array structure, a first penetration contact and a second penetration contact penetrating the cell array structure and the first insulating layer, and an input/output pad on the second penetration contact, and a controller electrically connected to the three-dimensional semiconductor memory device through the input/output pad and configured to control the three-dimensional semiconductor memory device. The cell array structure may include a stack structure including interlayer dielectric layers and gate electrodes, which are alternately and repeatedly stacked on the peripheral circuit structure, and a second substrate on the stack structure. The stack structure may be located between the peripheral circuit structure and the second substrate. The first penetration contact may be provided to penetrate the second substrate, and the second penetration contact may be spaced apart from the second substrate. The first and second penetration contacts may have width decreasing with increasing distance from the first substrate.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
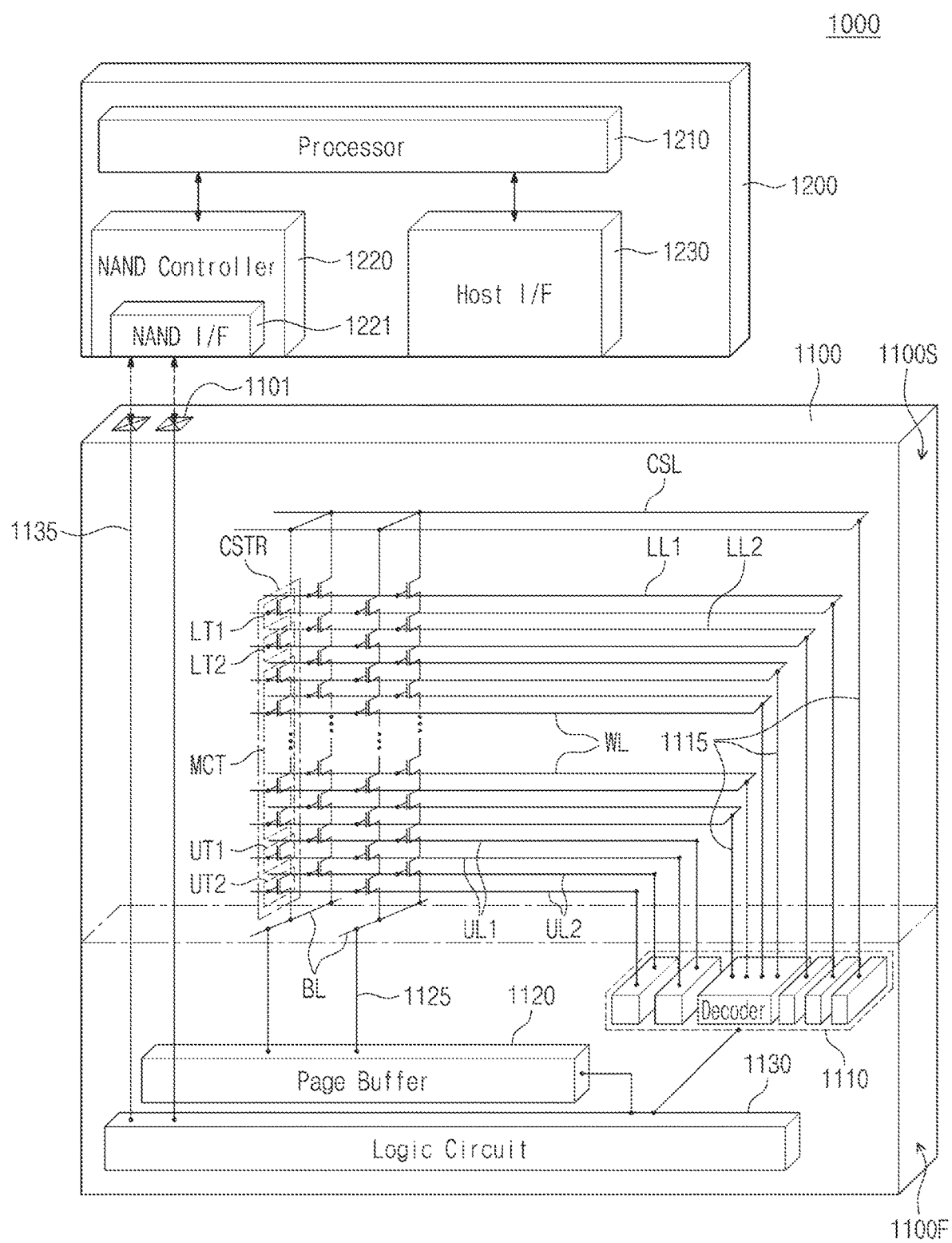
FIG. 1 is a diagram of an electronic system including a three-dimensional semiconductor memory device, according to an embodiment.

FIG. 1 is a diagram of an electronic system including a three-dimensional semiconductor memory device, according to an embodiment.

Referring to FIG. 1, an electronic system 1000 may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100 or an electronic device including the storage device. For example, the electronic system 1000 may be a solid state drive (SSD) device, a universal serial bus (USB), a computing system, a medical system, or a communication system, in which at least one three-dimensional semiconductor memory devices 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S on the first region 1100F. However, unlike that illustrated in the drawings, the first region 1100F may be disposed at a side of the second region 1100S. The first region 1100F may be a peripheral circuit region, which includes a decoder circuit 1110, a page buffer 1120, and a logic circuit 1130. The second region 1100S may be a memory cell region, which includes bit lines BL, a common source line CSL, word lines WL, first lines LL1 and LL2, second lines UL1 and UL2, and memory cell strings CSTR between the bit lines BL and the common source line CSL.

In the second region 1100S, each of the memory cell strings CSTR may include first transistors LT1 and LT2 adjacent to the common source line CSL, second transistors UT1 and UT2 adjacent to the bit lines BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed, according to embodiments. The memory cell strings CSTR may be positioned between the common source line CSL and the first region 1100F.

For example, the second transistors UT1 and UT2 may include a string selection transistor, and the first transistors LT1 and LT2 may include a ground selection transistor. The first lines LL1 and LL2 may serve as gate electrodes of the first transistors LT1 and LT2. The word lines WL may serve as gate electrodes of the memory cell transistors MCT, and the second lines UL1 and UL2 may serve as gate electrodes of the second transistors UT1 and UT2.

For example, the first transistors LT1 and LT2 may include a first erase control transistor LT1 and a ground selection transistor LT2, which are connected in series. For example, the second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which are extended from the first region 1100F to the second region 1100S. The bit lines BL may be electrically connected to the page buffer 1120 through second interconnection lines 1125, which are extended from the first region 1100F to the second region 1100S.

In the first region 1100F, the decoder circuit 1110 and the page buffer 1120 may be configured to perform a control operation, which is performed on at least one selected transistor of the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which is extended from the first region 1100F to the second region 1100S.

The controller 1200 may include a processor 1210, a NAND controller 1220, and a host interface (I/F) 1230. In an embodiment, the electronic system 1000 may include a plurality of three-dimensional semiconductor memory devices 1100, which are controlled by the controller 1200.

The processor 1210 may control overall operations of the electronic system 1000 including the controller 1200. Based on a specific firmware, the processor 1210 may execute operations of controlling the NAND controller 1220 and accessing the three-dimensional semiconductor memory device 1100. The NAND controller 1220 may include a NAND interface (I/F) 1221, which is used for communication with the three-dimensional semiconductor memory device 1100. The NAND interface 1221 may be used to transmit and receive control commands to control the three-dimensional semiconductor memory device 1100, data to be written in or read from the memory cell transistors MCT of the three-dimensional semiconductor memory device 1100, and so forth. The host interface 1230 may be configured to allow for communication between the electronic system 1000 and an external host. If a control command is provided from an external host through the host interface 1230, the processor 1210 may control the semiconductor device 1100 in response to the control command.

Figure 2:
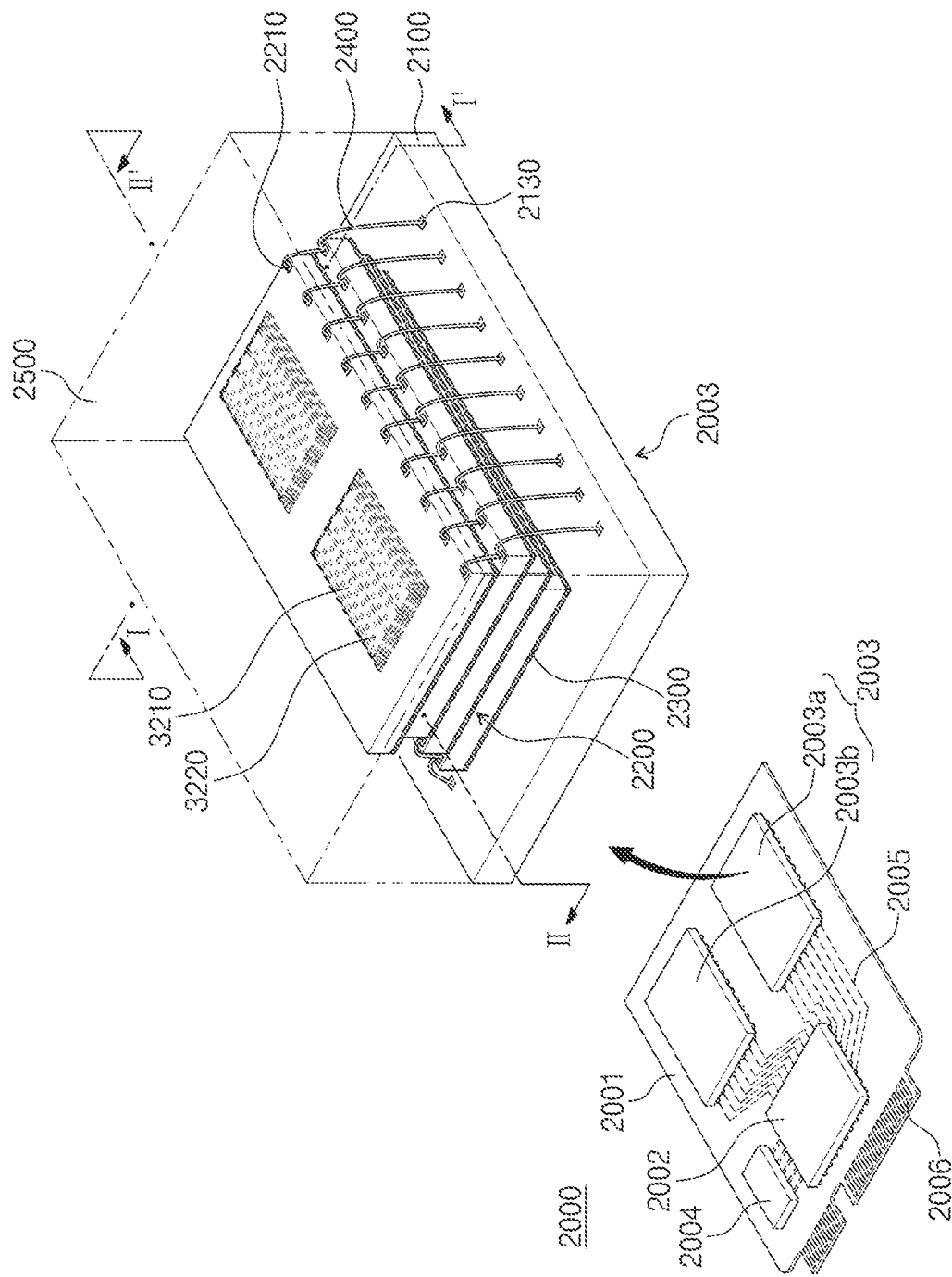
FIG. 2 is a perspective view of an electronic system including a three-dimensional semiconductor memory device, according to an embodiment.

FIG. 2 is a perspective view of an electronic system including a three-dimensional semiconductor memory device, according to an embodiment.

Referring to FIG. 2, an electronic system 2000 may include a main substrate 2001, and a controller 2002, one or more semiconductor packages 2003, and a dynamic random-access memory (DRAM) 2004, which are mounted on the main substrate 2001. The semiconductor package 2003 and the DRAM 2004 may be connected to the controller 2002 and to each other by interconnection patterns 2005, which are provided in the main substrate 2001.

The main substrate 2001 may include a connector 2006, which includes a plurality of pins coupled to an external host. In the connector 2006, the number and the arrangement of the pins may be changed depending on a communication interface between the electronic system 2000 and an external host. For example, the electronic system 2000 may communicate with the external host, in accordance with one of interfaces, e.g., universal serial bus (USB), peripheral component interconnect express (PCI-Express), serial advanced technology attachment (SATA), universal flash storage (UFS) M-PHY, or the like. In an embodiment, the electronic system 2000 may be driven by an electric power, which is supplied from the external host through the connector 2006. The electronic system 2000 may further include a power management integrated circuit (PMIC) that is used to separately supply the electric power, which is provided from the external host, to the controller 2002 and the semiconductor package 2003.

The controller 2002 may control a writing or reading operation on the semiconductor package 2003 and may improve an operation speed of the electronic system 2000.

The DRAM 2004 may be a buffer memory, which relieves technical difficulties caused by a difference in speed between the semiconductor package 2003, which serves as a data storage device, and an external host. In an embodiment, the DRAM 2004 in the electronic system 2000 may serve as a cache memory and may provide a storage space, in which data can be temporarily stored when a control operation is executed on the semiconductor package 2003. In the case where the electronic system 2000 includes the DRAM 2004, the controller 2002 may further include a DRAM controller that is used to control the DRAM 2004, in addition to a NAND controller that is used to control the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200, which are provided on the package substrate 2100, adhesive layers 2300, which are respectively disposed on bottom surfaces of the semiconductor chips 2200, connection structures 2400, which are used to electrically connect the semiconductor chips 2200 to the package substrate 2100, and a molding layer 2500, which is provided on the package substrate 2100 to cover the semiconductor chips 2200 and the connection structures 2400.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and memory channel structures 3220. Each of the semiconductor chips 2200 may include a three-dimensional semiconductor memory device, which will be described below.

The connection structures 2400 may be, e.g., bonding wires, which are used to electrically connect the input/output pads 2210 to the package upper pads 2130. That is, in each of the first and second semiconductor packages 2003a and 2003b, the semiconductor chips 2200 may be electrically connected to each other in a bonding wire manner and may be electrically connected to the package upper pads 2130 of the package substrate 2100. In an embodiment, the semiconductor chips 2200 in each of the first and second semiconductor packages 2003a and 2003b may be electrically connected to each other by through silicon vias (TSVs), not by the connection structure 2400 provided in the form of bonding wires.

In another example, unlike that illustrated in FIG. 2, the controller 2002 and the semiconductor chips 2200 may be included in a single package. In an embodiment, the controller 2002 and the semiconductor chips 2200 may be mounted on a separate interposer substrate, not on the main substrate 2001, and may be connected to each other through interconnection lines, which are provided in the interposer substrate.

Figure 3:
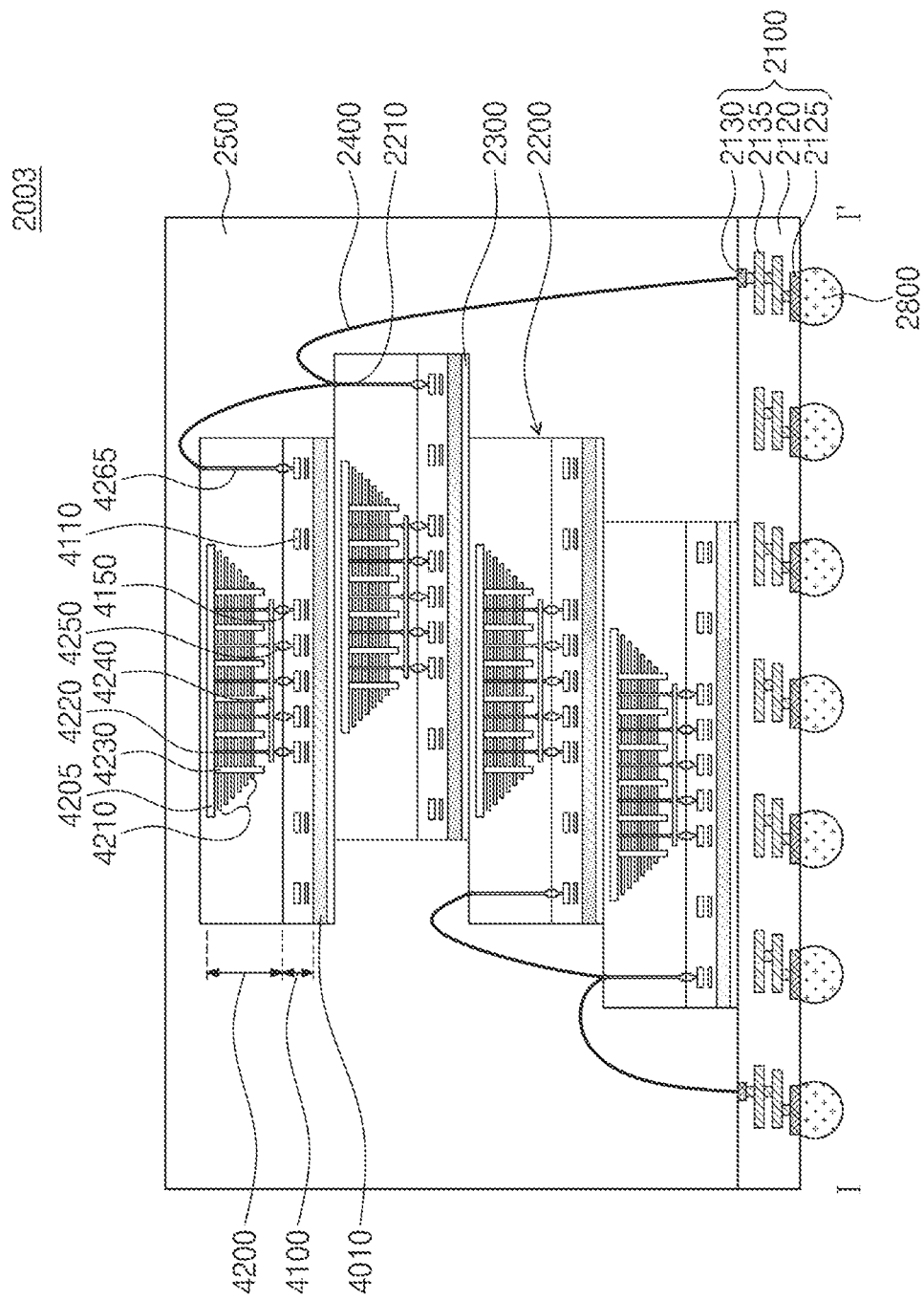
FIGS. 3 and 4 are sectional views along lines I-I' and II-II' of FIG. 2, respectively.
Figure 4:
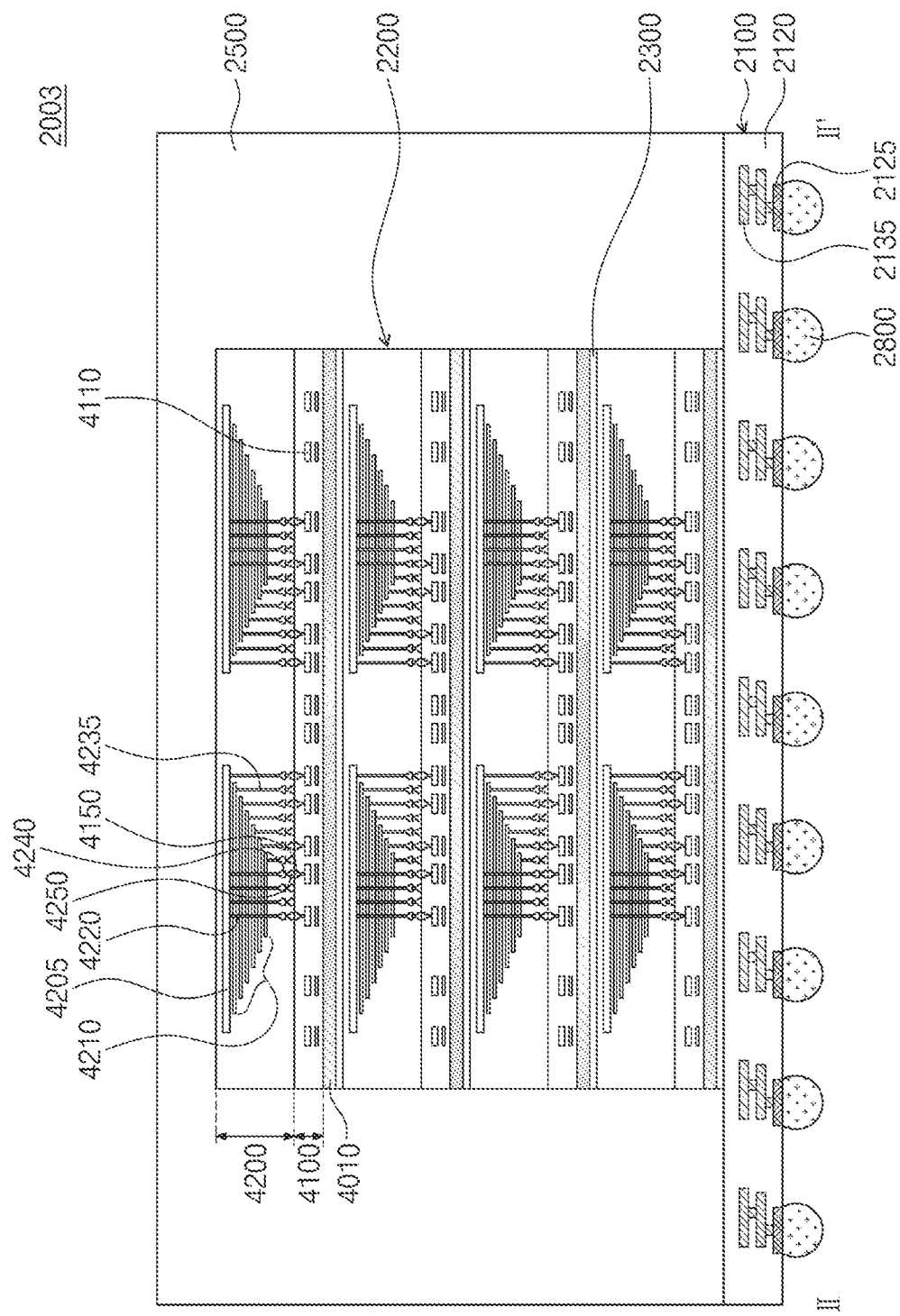

FIGS. 3 and 4 are sectional views, which are respectively taken along lines I-I' and II-II' of FIG. 2 to illustrate a semiconductor package including a three-dimensional semiconductor memory device, according to an embodiment.

Referring to FIGS. 3 and 4, the semiconductor package 2003 may include the package substrate 2100, the semiconductor chips 2200 on the package substrate 2100, and the molding layer 2500 covering the package substrate 2100 and the semiconductor chips 2200.

The package substrate 2100 may include a package substrate body portion 2120, the upper pads 2130, which are provided on a top surface of the package substrate body portion 2120 and are exposed to the outside of the package substrate body portion 2120 near the top surface, lower pads 2125, which are provided on a bottom surface of the package substrate body portion 2120 or are exposed to the outside of the package substrate body portion 2120 near the bottom surface, and internal lines 2135, which are provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000, which is shown in FIG. 2, through conductive connecting portions 2800.

Referring to FIGS. 2 and 3, the semiconductor chips 2200 may be provided such that some of side surfaces are not aligned to each other and the others are aligned to each other. The semiconductor chips 2200 may be electrically connected to each other through the connection structures 2400, which are provided in the form of bonding wires. Each of the semiconductor chips 2200 may include substantially the same elements.

Each of the semiconductor chips 2200 may include a semiconductor substrate 4010, a first structure 4100 on the semiconductor substrate 4010, and a second structure 4200 on the first structure 4100. The second structure 4200 may be connected to the first structure 4100 in a wafer bonding manner.

The first structure 4100 may include peripheral circuit interconnection lines 4110 and first bonding pads 4150. The second structure 4200 may include a common source line 4205, a gate stack structure 4210, which is provided between the common source line 4205 and the first structure 4100, memory channel structures 4220 and separation structures 4230, which are provided to penetrate the gate stack structure 4210, and second bonding pads 4250, which are electrically and respectively connected to the memory channel structures 4220 and the word lines WL (e.g., see FIG. 1) of the gate stack structure 4210. For example, the second bonding pads 4250 may be electrically connected to the memory channel structures 4220 and the word lines WL, respectively, through bit lines 4240, which are electrically connected to the memory channel structures 4220, and gate interconnection lines 4235, which are electrically connected to the word lines WL. The first bonding pads 4150 of the first structure 4100 and the second bonding pads 4250 of the second structure 4200 may be in contact with each other and may be coupled to each other. The coupling portions between the first bonding pads 4150 and the second bonding pads 4250 may be formed of or include, e.g., copper (Cu).

Each of the semiconductor chips 2200 may further include the input/output pad 2210 and an input/output interconnection line 4265 below the input/output pad 2210. The input/output interconnection line 4265 may be electrically connected to some of the second bonding pads 4250 and some of the peripheral circuit interconnection lines 4110.

Figure 5:
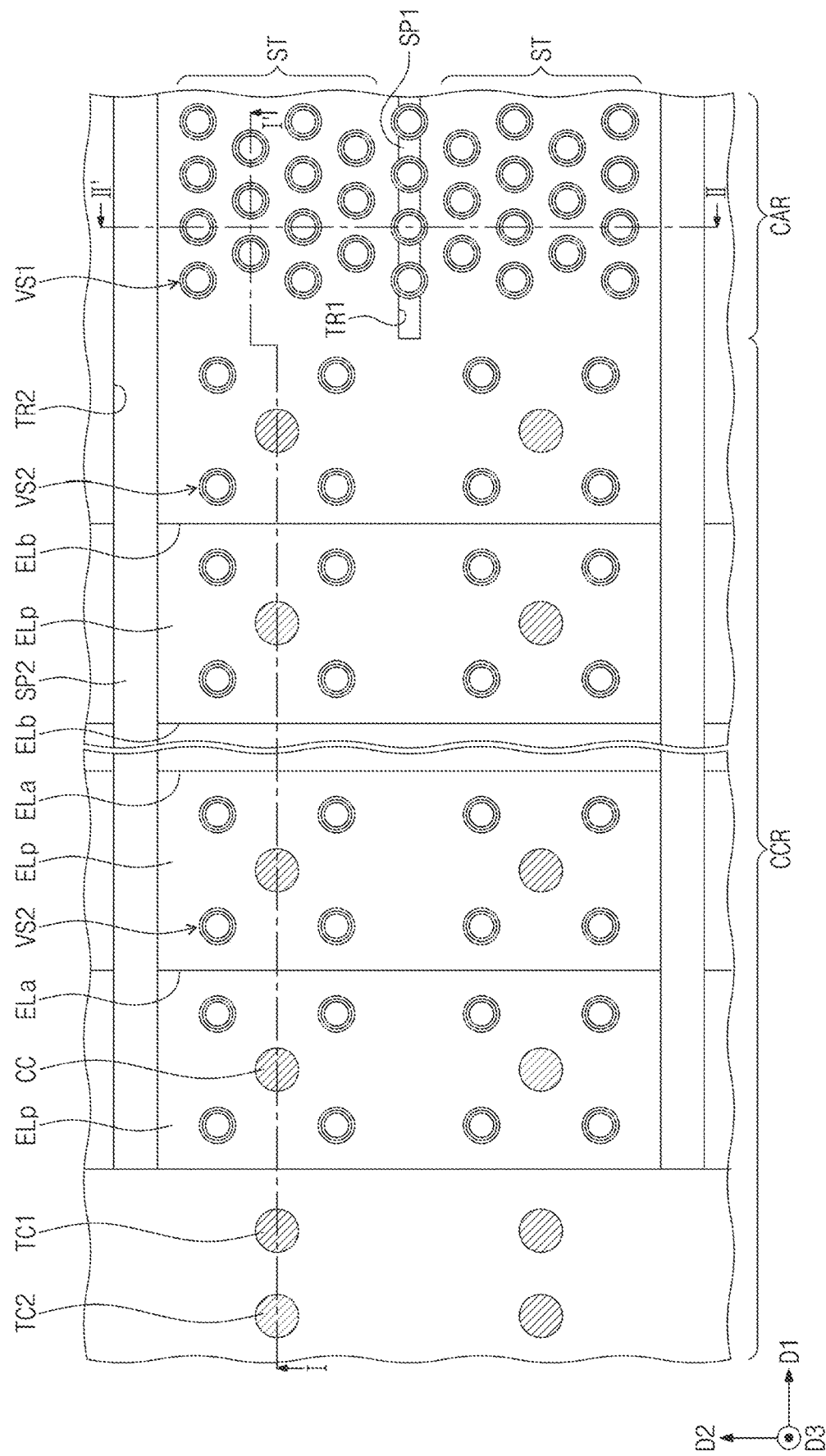
FIG. 5 is a plan view of a three-dimensional semiconductor memory device according to an embodiment.
Figure 6A:
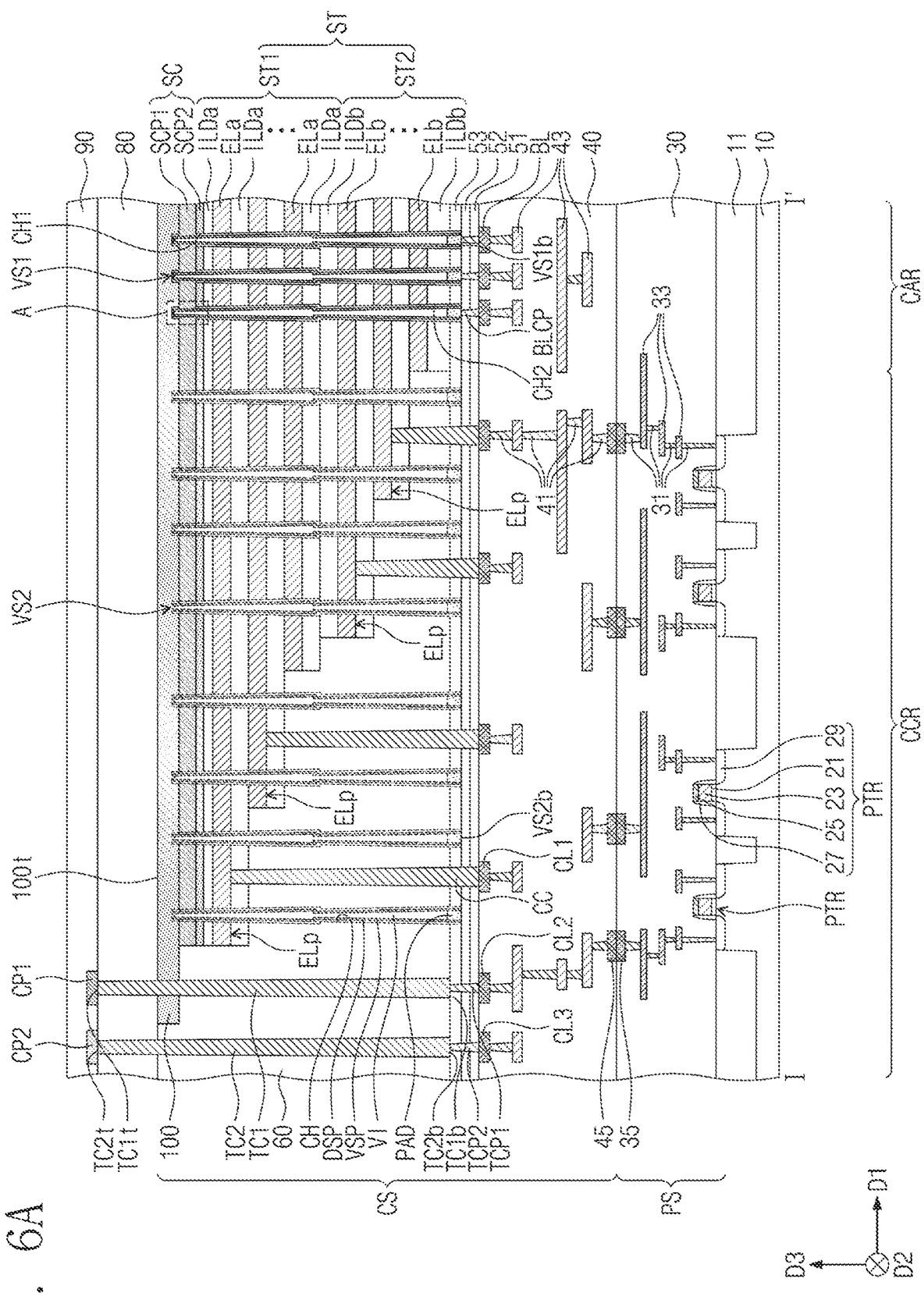
FIGS. 6A and 6B are sectional views along lines I-I' and II-II' of FIG. 5, respectively, according to an embodiment.
Figure 6B:
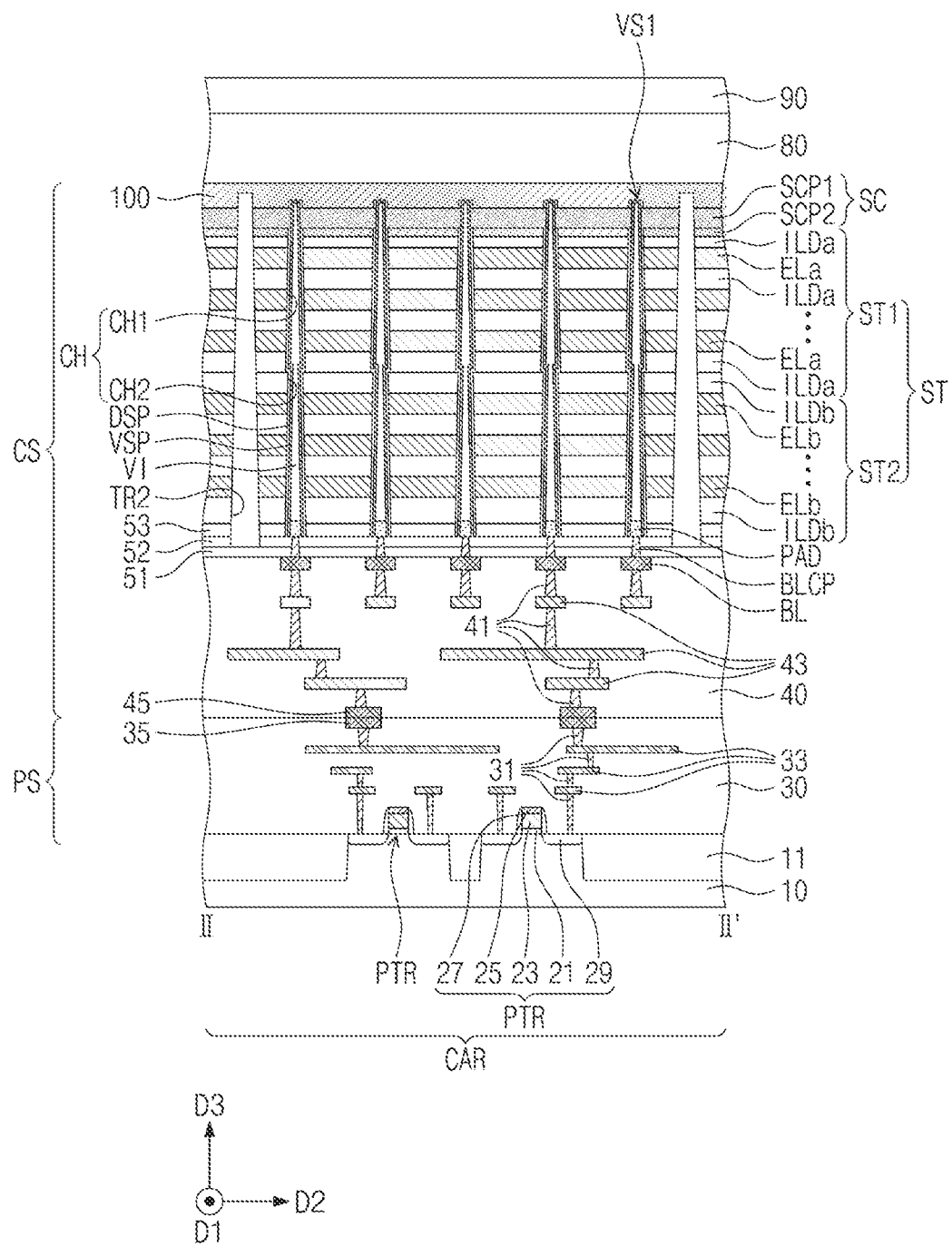

FIG. 5 is a plan view of a three-dimensional semiconductor memory device according to an embodiment. FIGS. 6A and 6B are sectional views, which are respectively taken along lines I-I' and II-II' of FIG. 5 to illustrate a three-dimensional semiconductor memory device according to an embodiment.

Referring to FIGS. 5, 6A, and 6B, a three-dimensional semiconductor memory device according to an embodiment may include a first substrate 10, a peripheral circuit structure PS on the first substrate 10, and a cell array structure CS on the peripheral circuit structure PS. The first substrate 10, the peripheral circuit structure PS, and the cell array structure CS may correspond to the semiconductor substrate 4010, the first structure 4100 on the semiconductor substrate 4010, and the second structure 4200 on the first structure 4100, respectively, described with reference to FIGS. 3 and 4.

Since the cell array structure CS is coupled to the peripheral circuit structure PS, the three-dimensional semiconductor memory device may have an increased cell capacity per unit area. In addition, the peripheral circuit structure PS and the cell array structure CS may be separately fabricated and then may be coupled to each other, and in this case, it may be possible to prevent peripheral transistors PTR from being damaged by several thermal treatment processes. Accordingly, the reliability and electric characteristics of the three-dimensional semiconductor memory device may be improved.

In an embodiment, the first substrate 10 may be, e.g., a silicon substrate, a silicon-germanium substrate, a germanium substrate, or a structure including a single-crystalline silicon substrate and a single crystalline epitaxial layer grown therefrom. The first substrate 10 may have a top surface that is parallel to two different directions (e.g., a first direction D1 and a second direction D2) and is perpendicular to a third direction D3. For example, the first to third directions D1, D2, and D3 may be orthogonal to each other. A device isolation layer 11 may be provided in the first substrate 10. The device isolation layer 11 may define an active region of the first substrate 10.

Hereinafter, in the following description with reference to FIGS. 5, 6A, 6B, 7, and 8, the term 'top surface' may be defined as a surface oriented in a positive third direction D3, e.g., oriented in the third direction D3 from the peripheral circuit structure PS toward the cell array structure CS. The term 'bottom surface' may be defined as a surface oriented in an opposite direction of the positive third direction D3, e.g., oriented in the third direction D3 from the cell array structure CS toward the peripheral circuit structure PS. Further, the terms 'top' and 'bottom' are merely for identification and differentiation, and can exchanged with 'first' and 'second' or be interchanged.

The first substrate 10 may include a cell array region CAR and a contact region CCR. The contact region CCR may be extended from the cell array region CAR in the first direction D1 or in an opposite direction of the first direction D1.

The peripheral circuit structure PS may be provided on the first substrate 10, and in an embodiment, the peripheral circuit structure PS may include the peripheral transistors PTR, peripheral contact plugs 31, peripheral circuit interconnection lines 33 electrically connected to the peripheral transistors PTR through the peripheral contact plugs 31, first bonding pads 35 electrically connected to the peripheral circuit interconnection lines 33, and a first insulating layer 30 enclosing them. The peripheral transistors PTR may be provided on the active region of the first substrate 10. The peripheral circuit interconnection lines 33 may correspond to the peripheral circuit interconnection lines 4110 of FIGS. 3 and 4, and the first bonding pads 35 may correspond to the first bonding pads 4150 of FIGS. 3 and 4.

In an embodiment, widths of the peripheral contact plugs 31 in the first or second direction D1 or D2 may increase in the third direction D3 (i.e., with increasing distance from the first substrate 10). The peripheral contact plugs 31 and the peripheral circuit interconnection lines 33 may be formed of or include at least one of conductive (e.g., metallic) materials.

In an embodiment, the peripheral transistors PTR may constitute at least one of the decoder circuit 1110, the page buffer 1120, and the logic circuit 1130 of FIG. 1. More specifically, each of the peripheral transistors PTR may include a peripheral gate insulating layer 21, a peripheral gate electrode 23, a peripheral capping pattern 25, a peripheral gate spacer 27, and peripheral source/drain regions 29. The peripheral gate insulating layer 21 may be provided between the peripheral gate electrode 23 and the first substrate 10. The peripheral capping pattern 25 may be provided on the peripheral gate electrode 23. The peripheral gate spacer 27 may cover side surfaces of the peripheral gate insulating layer 21, the peripheral gate electrode 23, and the peripheral capping pattern 25. The peripheral source/drain regions 29 may be provided in portions of the first substrate 10, which are located at both sides of the peripheral gate electrode 23. The peripheral circuit interconnection lines 33 and the first bonding pads 35 may be electrically connected to the peripheral transistors PTR through the peripheral contact plugs 31. Each of the peripheral transistors PTR may be an NMOS transistor or a PMOS transistor and, in an embodiment, it may be a gate-all-around type transistor.

The first insulating layer 30 may be provided on the first substrate 10. The first insulating layer 30 may be provided on the first substrate 10 to cover the peripheral transistors PTR, the peripheral contact plugs 31, and the peripheral circuit interconnection lines 33. The first insulating layer 30 may have a multi-layered structure including a plurality of insulating layers. For example, the first insulating layer 30 may be formed of or include at least one of silicon oxide, silicon nitride, silicon oxynitride, and/or low-k dielectric materials. The first insulating layer 30 may not cover top surfaces of the first bonding pads 35. The first insulating layer 30 may have a top surface that is substantially coplanar with the top surfaces of the first bonding pads 35.

The cell array structure CS, which includes second bonding pads 45, the bit lines BL, a stack structure ST, and a second substrate 100, may be provided on the peripheral circuit structure PS. The second bonding pads 45, the bit lines BL, the stack structure ST, and the second substrate 100 may correspond to the second bonding pads 4250, the bit lines 4240, the gate stack structure 4210, and the common source line 4205, respectively, which are illustrated in FIGS. 3 and 4.

A second insulating layer 40, connection contact plugs 41, connection circuit interconnection lines 43, and the second bonding pads 45 may be provided on the first insulating layer 30. Each of the second bonding pads 45 may be in contact with each of the first bonding pads 35 of the peripheral circuit structure PS, and the connection circuit interconnection lines 43 may be electrically connected to the second bonding pads 45 through the connection contact plugs 41. The second insulating layer 40 may be provided to enclose the connection contact plugs 41, the connection circuit interconnection lines 43, and the second bonding pads 45. The second insulating layer 40 may have a multi-layered structure including a plurality of insulating layers. For example, the second insulating layer 40 may be formed of or include at least one of silicon oxide, silicon nitride, silicon oxynitride, and/or low-k dielectric materials.

In an embodiment, widths of the connection contact plugs 41 measured in the first or second direction D1 or D2 may decrease in the third direction D3. The connection contact plugs 41 and the connection circuit interconnection lines 43 may be formed of or include at least one of conductive (e.g., metallic) materials.

The second insulating layer 40 may not cover bottom surfaces of the second bonding pads 45. A bottom surface of the second insulating layer 40 may be substantially coplanar with the bottom surfaces of the second bonding pads 45. The bottom surface of each of the second bonding pads 45 may be in direct contact with the top surface of a corresponding one of the first bonding pads 35. The first and second bonding pads 35 and 45 may be formed of or include at least one of metallic materials (e.g., copper (Cu), tungsten (W), aluminum (Al), nickel (Ni), or tin (Sn)). For example, the first and second bonding pads 35 and 45 may be formed of or include copper (Cu). The first and second bonding pads 35 and 45 may be integrally bonded to each other without any interface therebetween, thereby forming a single object. For example, side surfaces of the first and second bonding pads 35 and 45 may be aligned with each other, as illustrated in FIGS. 6A and 6B. In another example, the side surfaces of the first and second bonding pads 35 and 45 may be spaced apart from each other, when viewed in a plan view.

The bit lines BL and first, second and third conductive lines CL1, CL2, and CL3, which are in contact with the connection contact plugs 41, may be provided in an upper portion of the second insulating layer 40. The bit lines BL and the first, second and third conductive lines CL1, CL2, and CL3 may be, e.g., extended in the second direction D2 and may be spaced apart from each other in the first direction D1. The bit lines BL, the first, second and third conductive lines CL1, CL2, and CL3 may be formed of or include at least one of conductive (e.g., metallic) materials.

A third insulating layer 51, a fourth insulating layer 52, and a fifth insulating layer 53 may be sequentially provided on the second insulating layer 40. The stack structure ST and a sixth insulating layer 60 enclosing the stack structure ST may be provided on the fifth insulating layer 53. A bottom surface of the stack structure ST (i.e., in contact with the fifth insulating layer 53) may be substantially coplanar with a bottom surface of the sixth insulating layer 60. Each of the third to sixth insulating layers 51, 52, 53, and 60 may have a multi-layered structure including a plurality of insulating layers. For example, each of the third to sixth insulating layers 51, 52, 53, and 60 may be formed of or include at least one of silicon oxide, silicon nitride, silicon oxynitride, and/or low-k dielectric materials.

Bit line contact plugs BLCP may be provided to penetrate the third insulating layer 51 and the fourth insulating layer 52. The bit line contact plugs BLCP may be extended in the third direction D3 to connect the bit lines BL to first vertical channel structures VS1.

First and second penetration contact plugs TCP1 and TCP2 may be provided to penetrate the third to fifth insulating layers 51, 52, and 53. The first and second penetration contact plugs TCP1 and TCP2 may be extended in the third direction D3. The first penetration contact plug TCP1 may be provided between the second conductive line CL2 and a first penetration contact TC1 to connect them to each other. The second penetration contact plug TCP2 may be provided between the third conductive line CL3 and a second penetration contact TC2 to connect them to each other.

Cell contacts CC may be provided to penetrate the third to sixth insulating layers 51, 52, 53, and 60, and the first and second penetration contacts TC1 and TC2 may be provided to penetrate the sixth insulating layer 60. The cell contacts CC may be extended in the third direction D3 to connect the first conductive lines CL1 to first and second gate electrodes ELa and ELb of the stack structure ST. Each of the cell contacts CC may be provided to penetrate one of first and second interlayer dielectric layers ILDa and ILDb of the stack structure ST.

The first penetration contact TC1 may be extended in the third direction D3 to connect the second conductive line CL2, the second substrate 100, and a first conductive pad CP1 to each other. The second penetration contact TC2 may be extended in the third direction D3 to connect the third conductive line CL3 to a second conductive pad CP2. The first penetration contact TC1 may be provided to penetrate the second substrate 100 and a seventh insulating layer 80. A portion of a side surface of the first penetration contact TC1 may be in direct contact with the second substrate 100. The first penetration contact TC1 may be spaced apart from the stack structure ST and the outermost one of the cell contacts CC in the first direction D1. The second penetration contact TC2 may be provided to penetrate the seventh insulating layer 80, and may be spaced apart from a side surface of the second substrate 100 in the first direction D1. For example, as illustrated in FIG. 6A, the second penetration contact TC2 may be horizontally spaced apart from an outermost lateral edge of the second substrate 100, e.g., a portion of the sixth insulating layer 60 may completely separate a side surface of the second penetration contact TC2 from the second substrate 100, so the second penetration contact TC2 may not penetrate the second substrate 100. The second penetration contact TC2 may be spaced apart from the stack structure ST in the first direction D1, with the first penetration contact TC1 interposed therebetween. The second penetration contact TC2 may correspond to the input/output interconnection line 4265 of FIG. 3.

A bottom surface TC1*b* of the first penetration contact TC1 and a bottom surface TC2*b* of the second penetration contact TC2 may be located at a height level that is different from bottom surfaces of the cell contacts CC and bottom surfaces VS1b and VS2b of the first and second vertical channel structures VS1 and VS2, e.g., along the third direction D3 relative to a bottom surface of the first substrate 10. For example, the bottom surface TC1b of the first penetration contact TC1 and the bottom surface TC2b of the second penetration contact TC2 may be located at a level that is higher than the bottom surfaces of the cell contacts CC and the bottom surfaces VS1b and VS2b of the first and second vertical channel structures VS1 and VS2, e.g., relative to the peripheral circuit structure PS.

A top surface TC1t of the first penetration contact TC1 and a top surface TC2t of the second penetration contact TC2 may be located at a level that is higher than a top surface 100t of the second substrate 100, e.g., relative to the peripheral circuit structure PS. A diameter of the first penetration contact TC1 may be smaller at a level of the top surface TC1t than at a level of the bottom surface TC1b, and a diameter of the second penetration contact TC2 may be smaller at a level of the top surface TC2t than at a level of the bottom surface TC2b. For example, referring to FIG. 6A, a diameter of each of the first penetration contact TC1 and the second penetration contact TC2 may gradually decrease along an entire height of each of the first penetration contact TC1 and the second penetration contact TC2 along the third direction D3, e.g., in a direction oriented from the seventh insulating layer 80 to the fifth insulating layer 53. Each of the first and second penetration contacts TC1 and TC2 may have the smallest diameter at the level of its top surface TC1t or TC2t.

The cell contacts CC and the first and second penetration contacts TC1 and TC2 may be spaced apart from each other in the first direction D1. In each of the bit line contact plugs BLCP, the first and second penetration contact plugs TCP1 and TCP2, the cell contacts CC, and the first and second penetration contacts TC1 and TC2, a width measured in the first or second direction D1 or D2 may decrease in the third direction D3. The bit line contact plugs BLCP, the first and second penetration contact plugs TCP1 and TCP2, the cell contacts CC, and the first and second penetration contacts TC1 and TC2 may be formed of or include at least one of conductive (e.g., metallic) materials.

In an embodiment, a plurality of stack structures ST may be provided. The stack structures ST may be extended in the first direction D1 and may be spaced apart from each other in the second direction D2, when viewed in the plan view of FIG. 5. Hereinafter, just one stack structure ST will be described, for brevity's sake, but the others of the stack structures ST may also have substantially the same features as described below.

The stack structure ST may include a first stack structure ST1 and a second stack structure ST2. The first stack structure ST1 may include the first interlayer dielectric layers ILDa and the first gate electrodes ELa, which are alternately and repeatedly stacked, and the second stack structure ST2 may include the second interlayer dielectric layers ILDb and the second gate electrodes ELb, which are alternately and repeatedly stacked.

The second stack structure ST2 may be provided between the first stack structure ST1 and the first substrate 10. More specifically, the second stack structure ST2 may be provided on a bottom surface of the bottommost one of the first interlayer dielectric layers ILDa of the first stack structure ST1. The topmost one of the second interlayer dielectric layers ILDb of the second stack structure ST2 may be in contact with the bottommost one of the first interlayer dielectric layers ILDa of the first stack structure ST1. For example, a single insulating layer may be provided between the topmost one of the second gate electrodes ELb of the second stack structure ST2 and the bottommost one of the first gate electrodes ELa of the first stack structure ST1.

The first and second gate electrodes ELa and ELb may be formed of or include at least one of, e.g., doped semiconductor materials (e.g., doped silicon and so forth), metallic materials (e.g., tungsten, copper, aluminum, and so forth), conductive metal nitrides (e.g., titanium nitride, tantalum nitride, and so forth), or transition metals (e.g., titanium, tantalum, and so forth). The first and second interlayer dielectric layers ILDa and ILDb may be formed of or include at least one of silicon oxide, silicon nitride, silicon oxynitride, and/or low-k dielectric materials. For example, the first and second interlayer dielectric layers ILDa and ILDb may be formed of or include high density plasma (HDP) oxide or tetraethyl orthosilicate (TEOS).

On the contact region CCR, a thickness of each of the first and second stack structures ST1 and ST2 in the third direction D3 may decrease with increasing distance from the outermost one of the first vertical channel structures VS1. In other words, each of the first and second stack structures ST1 and ST2 may have a staircase structure in the first direction D1.

More specifically, lengths of the first gate electrodes ELa of the first stack structure ST1 and the second gate electrodes ELb of the second stack structure ST2 in the first direction D1 may increase with increasing distance from the first substrate 10. Side surfaces of the first and second gate electrodes ELa and ELb may be spaced apart from each other by a constant distance in the first direction D1, when viewed in the plan view of FIG. 5. The lowermost one of the second gate electrodes ELb of the second stack structure ST2 may have the smallest length in the first direction D1, and the uppermost one of the first gate electrodes ELa of the first stack structure ST1 may have the largest length in the first direction D1.

The first and second gate electrodes ELa and ELb may include pad portions ELp provided on the contact region CCR. The pad portions ELp may be disposed at positions that are different from each other in horizontal and vertical directions. The pad portions ELp may form a staircase structure in the first direction D1. The cell contacts CC may penetrate one of the first and second interlayer dielectric layers ILDa and ILDb and may be in contact with the pad portions ELp of the first and second gate electrodes ELa and ELb.

Each of the first and second interlayer dielectric layers ILDa and ILDb may be provided between a corresponding pair of the first and second gate electrodes ELa and ELb and may have a side surface that is aligned to a side surface of a corresponding one of the first and second gate electrodes ELa and ELb disposed thereon. That is, lengths of the first and second interlayer dielectric layers ILDa and ILDb in the first direction D1 may increase with increasing distance from the first substrate 10, similar to the first and second gate electrodes ELa and ELb. The lowermost one of the second interlayer dielectric layers ILDb may have a thickness, which is larger than the others of the second interlayer dielectric layers ILDb, in the third direction D3, and the uppermost one of the first interlayer dielectric layers ILDa may have a thickness, which is larger than the others of the first interlayer dielectric layers ILDa, in the third direction D3.

On the cell array region CAR, vertical channel holes CH may be provided to penetrate the stack structure ST in the third direction D3, and the first vertical channel structures VS1 may be respectively provided in the vertical channel holes CH on the cell array region CAR. The first vertical channel structures VS1 may be arranged to form a zigzag shape in the first or second direction D1 or D2, when viewed in the plan view of FIG. 5. The first vertical channel structures VS1 may correspond to the memory channel structures 4220 of FIGS. 3 and 4. The first vertical channel structures VS1 may correspond to the channel regions of the first transistors LT1 and LT2, the memory cell transistors MCT, and the second transistors UT1 and UT2 of FIG. 1.

On the contact region CCR, the vertical channel holes CH may be provided to penetrate at least a portion of the stack structure ST, the fifth insulating layer 53, and the sixth insulating layer 60 in the third direction D3, and second vertical channel structures VS2 may be respectively provided in the vertical channel holes CH on the contact region CCR. The second vertical channel structures VS2 may be provided to penetrate the pad portions ELp of the first and second gate electrodes ELa and ELb. The second vertical channel structures VS2 may be provided around the cell contacts CC, when viewed in the plan view of FIG. 5. The first and second vertical channel structures VS1 and VS2 may be formed at the same time and may have substantially the same structure. However, in an embodiment, the second vertical channel structures VS2 may not be provided.

The vertical channel holes CH may include first vertical channel holes CH1 and second vertical channel holes CH2, which are connected to the first vertical channel holes CH1 in the third direction D3. In each of the first and second vertical channel holes CH1 and CH2, a width in the first or second direction D1 or D2 may decrease in the third direction D3. The first and second vertical channel holes CH1 and CH2 may have different diameters from each other near a boundary therebetween. In detail, an upper diameter of each of the second vertical channel holes CH2 may be smaller than a lower diameter of each of the first vertical channel holes CH1.

A side surface of each of the first and second vertical channel structures VS1 and VS2 may have a stepwise shape near a boundary between the first and second vertical channel holes CH1 and CH2. However, embodiments are not limited to this example, and the side surface of each of the first and second vertical channel structures VS1 and VS2 may have three or more stepwise portions located at different levels or may be a flat shape without a stepwise portion, unlike that illustrated in the drawings.

Each of the first and second vertical channel structures VS1 and VS2 may include a conductive pad PAD adjacent to the fifth insulating layer 53, a data storage pattern DSP conformally covering an inner side surface of each of the first and second vertical channel holes CH1 and CH2 (i.e., adjacent to the stack structure ST), a vertical semiconductor pattern VSP conformally covering a side surface of the data storage pattern DSP, and an insulating gap-fill pattern VI filling an internal space of each of the first and second vertical channel holes CH1 and CH2 enclosed by the vertical semiconductor pattern VSP and the conductive pad PAD. The vertical semiconductor pattern VSP may be enclosed by the data storage pattern DSP. Each of the first and second vertical channel structures VS1 and VS2 may have a circular, elliptical, or bar-shaped bottom surface.

The vertical semiconductor pattern VSP may be provided between the data storage pattern DSP and the insulating gap-fill pattern VI, and between the data storage pattern DSP and the conductive pad PAD. The vertical semiconductor pattern VSP may have a top-closed pipe or macaroni structure. The data storage pattern DSP may have a top-opened pipe or macaroni structure. The vertical semiconductor pattern VSP may be formed of or include at least one of doped semiconductor materials or undoped or intrinsic semiconductor materials and may have a poly-crystalline or single-crystalline structure. The conductive pad PAD may be formed of or include at least one of doped semiconductor materials or conductive materials.

When viewed in the plan view of FIG. 5, a first trench TR1 and second trenches TR2 may be provided to extend in the first direction D1 and to cross the stack structure ST. The first trench TR1 may be provided in the cell array region CAR, and the second trenches TR2 may be extended from the cell array region CAR toward the contact region CCR. In each of the first and second trenches TR1 and TR2, a width in the second direction D2 may decrease with increasing distance from the first substrate 10.

A first separation pattern SP1 may be provided to fill the first trench TR1, and second separation patterns SP2 may be provided to fill the second trenches TR2, respectively. Each of the first and second separation patterns SP1 and SP2 may be a plate-shaped structure that is extended in the first and third directions D1 and D3. The second separation patterns SP2 may correspond to the separation structures 4230 of FIGS. 3 and 4. A length of each of the second separation patterns SP2 in the first direction D1 may be larger than a length of the first separation pattern SP1 in the first direction D1. The first and second separation patterns SP1 and SP2 may have side surfaces that are in contact with side surfaces of the stack structure ST (e.g., side surfaces of the first and second gate electrodes ELa and ELb and the first and second interlayer dielectric layers ILDa and ILDb). The first and second separation patterns SP1 and SP2 may be formed of or include at least one of insulating materials (e.g., silicon oxide).

For example, bottom surfaces of the second separation patterns SP2 may be substantially coplanar with the bottom surface of the fourth insulating layer 52 or the top surface of the third insulating layer 51. In an embodiment, the bottom surfaces of the second separation patterns SP2 may be substantially coplanar with the bottom surface of the third insulating layer 51 or the top surface of the second insulating layer 40. The bottom surfaces of the second separation patterns SP2 may be located at a level that is lower than the bottom surfaces of the first and second vertical channel structures VS1 and VS2. In addition, top surfaces of the second separation patterns SP2 may be located at a level, which is higher than, e.g., the top surfaces of the first and second vertical channel structures VS1 and VS2.

In the case where the plurality of stack structures ST are provided, the first separation pattern SP1 or one of the second separation patterns SP2 may be provided between the stack structures ST arranged in the second direction D2. In other words, the stack structures ST may be spaced apart from each other in the second direction D2, with the first separation pattern SP1 or one of the second separation patterns SP2 interposed therebetween. In an embodiment, a plurality of the first separation patterns SP1 and a plurality of the second separation patterns SP2 may be provided, and in this case, the first separation patterns SP1 and the second separation patterns SP2 may be spaced apart from each other in the second direction D2 with one of the stack structures ST interposed therebetween.

The second substrate 100 may be provided on the stack structure ST. The second substrate 100 may be a plate-shaped structure extending in the first and second directions D1 and D2. A bottom surface of the second substrate 100 may be parallel to a top surface of the first substrate 10. The second substrate 100 may be extended from the cell array region CAR toward the contact region CCR. The second substrate 100 may not be provided on a portion of the contact region CCR. The second substrate 100 may be a semiconductor substrate including a semiconductor material. The second substrate 100 may be formed of or include at least one of, e.g., silicon (Si), germanium (Ge), silicon germanium (SiGe), gallium arsenic (GaAs), indium gallium arsenic (InGaAs), aluminum gallium arsenic (AlGaAs), or mixtures thereof.

A source structure SC may be provided between the stack structure ST and the second substrate 100. The source structure SC may be a plate-shaped structure which extends in the first and second directions D1 and D2 or is parallel to the top surface of the first substrate 10, the top surface of the stack structure ST, or the bottom surface of the second substrate 100. The source structure SC may be overlapped with the second substrate 100 in the third direction D3. However, a portion of the second substrate 100 may not be overlapped with the source structure SC in the third direction D3, and may be in direct contact with the sixth insulating layer 60 and the first penetration contact TC1.

Each of the first and second vertical channel structures VS1 and VS2 may be provided to penetrate the source structure SC and at least a portion of the second substrate 100. A lower portion of each of the first and second vertical channel structures VS1 and VS2 may be in contact with the second substrate 100. The vertical semiconductor pattern VSP of each of the first and second vertical channel structures VS1 and VS2 may be in contact with a portion of the source structure SC, as will be described with reference to FIG. 7.

The source structure SC may include a first source conductive pattern SCP1 on the stack structure ST and a second source conductive pattern SCP2 between the stack structure ST and the first source conductive pattern SCP1. The second source conductive pattern SCP2 may be provided between the first source conductive pattern SCP1 and the topmost one of the first interlayer dielectric layers ILDa of the first stack structure ST1. The second source conductive pattern SCP2 may be in direct contact with the first source conductive pattern SCP1. A thickness of the first source conductive pattern SCP1 in the third direction D3 may be larger than a thickness of the second source conductive pattern SCP2 in the third direction D3. The source structure SC may be formed of or include at least one of doped semiconductor materials. The source structure SC may be formed of or include a semiconductor material that is doped to have the same conductivity type as the second substrate 100. For example, an impurity concentration of the first source conductive pattern SCP1 may be larger than an impurity concentration of the second source conductive pattern SCP2 and an impurity concentration of the second substrate 100.

The seventh insulating layer 80 may be provided on the second substrate 100 and the sixth insulating layer 60. The first and second penetration contacts TC1 and TC2 may be provided to penetrate the seventh insulating layer 80. The seventh insulating layer 80 may have a substantially flat top surface, and the top surface TC1t of the first penetration contact TC1 and the top surface TC2t of the second penetration contact TC2 may be substantially coplanar with each other.

The first conductive pad CP1 may be provided on the seventh insulating layer 80 and the first penetration contact TC1, and the second conductive pad CP2 may be provided on the seventh insulating layer 80 and the second penetration contact TC2. The first and second conductive pads CP1 and CP2 may be formed of or include at least one of conductive (e.g., metallic) materials.

The first conductive pad CP1 may be in direct contact with the first penetration contact TC1 and may be electrically connected to the second substrate 100 and the second conductive line CL2 through the first penetration contact TC1 and the first penetration contact plug TCP1. The second conductive pad CP2 may be in direct contact with the second penetration contact TC2 and may be electrically connected to the third conductive line CL3 through the second penetration contact TC2 and the second penetration contact plug TCP2. Furthermore, each of the first and second conductive pads CP1 and CP2 may be electrically connected to at least one of the peripheral transistors PTR of the peripheral circuit structure PS through the second conductive line CL2 or the third conductive line CL3. The second conductive pad CP2 may correspond to the input/output pad 1101 of FIG. 1 or one of the input/output pads 2210 of FIGS. 3 and 4.

In addition, an eighth insulating layer 90 may be provided on the seventh insulating layer 80 to cover the first and second conductive pads CP1 and CP2. Further, additional lines or vias, which are respectively connected to the first and second conductive pads CP1 and CP2, may be provided in or on the eighth insulating layer 90.

In a three-dimensional semiconductor memory device according to an embodiment, the second substrate 100 may be grounded through the first penetration contact TC1 penetrating the seventh insulating layer 80, the second substrate 100, and the sixth insulating layer 60, without a bypass via provided on the second substrate 100, thereby preventing or substantially minimizing an arcing phenomenon, in which electric charges are accumulated in a portion of the second substrate 100. Accordingly, the reliability and electric characteristics of the three-dimensional semiconductor memory device may be improved.

Figure 7:
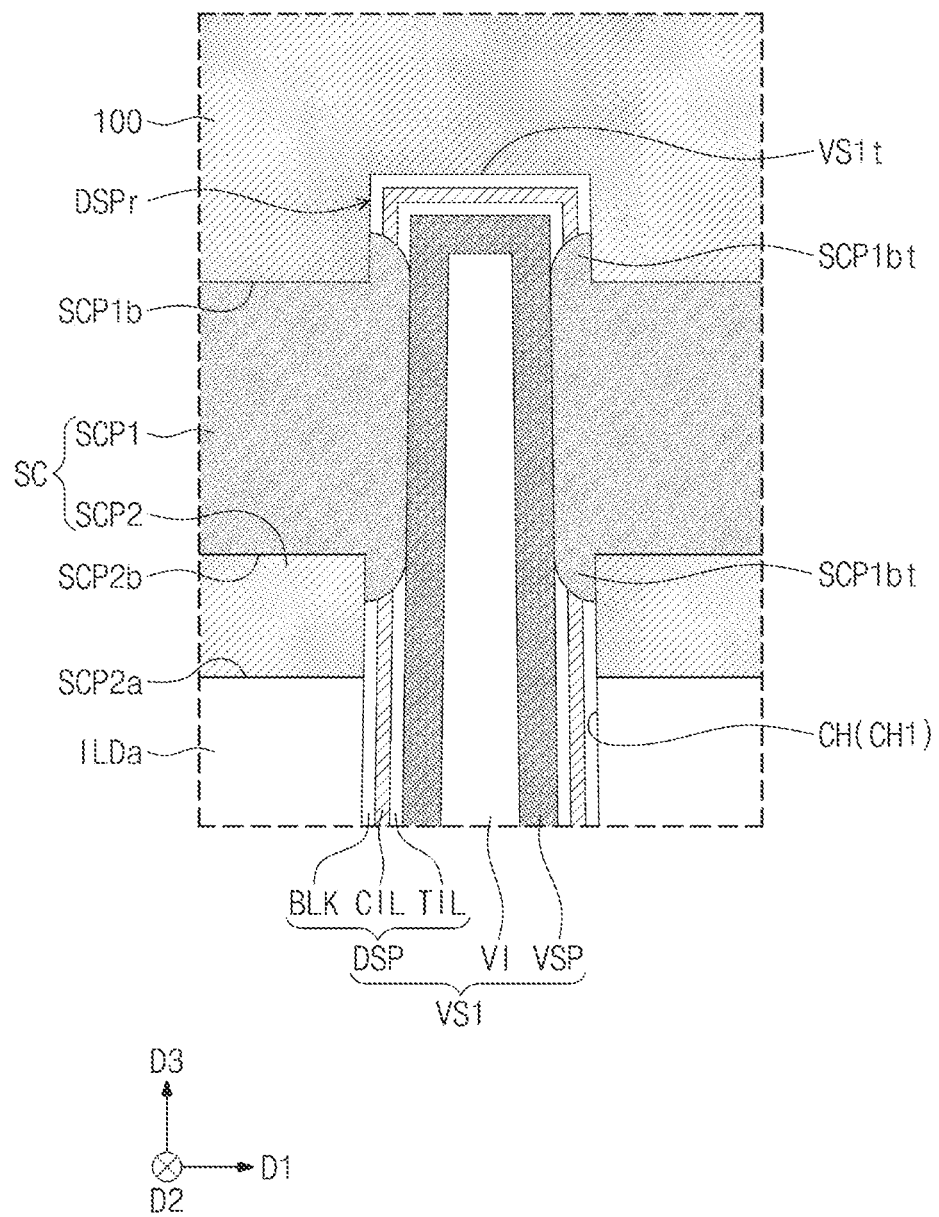
FIG. 7 is an enlarged sectional view of portion 'A' of FIG. 6A.

FIG. 7 is an enlarged sectional view of portion 'A' of FIG. 6A according to an embodiment.

FIG. 7 illustrates a portion of the source structure SC, a portion of the second substrate 100, and one of the first vertical channel structures VS1 including the data storage pattern DSP, the vertical semiconductor pattern VSP, the insulating gap-fill pattern VI, and the lower data storage pattern DSPr. The remaining ones of the vertical channel holes CH and the first vertical channel structures VS1 may have substantially the same features as those to be described with reference to FIGS. 6A and 7.

Referring to FIG. 7, a top surface VS1t of the first vertical channel structure VS1 may be in contact with the second substrate 100. The top surface VS1t of the first vertical channel structure VS1 may correspond to a top surface of the lower data storage pattern DSPr. The top surface VS1t of the first vertical channel structure VS1 may be located at a level higher than a top surface SCP1b of the first source conductive pattern SCP1.

The data storage pattern DSP may include a blocking insulating layer BLK, a charge storing layer CIL, and a tunneling insulating layer TIL, which are sequentially stacked on an inner side surface of the vertical channel hole CH. The blocking insulating layer BLK may be adjacent to the stack structure ST or the source structure SC, and the tunneling insulating layer TIL may be adjacent to the vertical semiconductor pattern VSP. The charge storing layer CIL may be interposed between the blocking insulating layer BLK and the tunneling insulating layer TIL. The blocking insulating layer BLK, the charge storing layer CIL, and the tunneling insulating layer TIL may be extended in the third direction D3, between the stack structure ST and the vertical semiconductor pattern VSP. In an embodiment, the Fowler-Nordheim (FN) tunneling phenomenon, which is caused by a voltage difference between the vertical semiconductor pattern VSP and the first and second gate electrodes ELa and ELb, may be used to store or change data in the data storage pattern DSP. For example, the blocking insulating layer BLK and the tunneling insulating layer TIL may be formed of or include silicon oxide, and the charge storing layer CIL may be formed of or include silicon nitride or silicon oxynitride.

The first source conductive pattern SCP1 of the source structure SC may be in contact with the vertical semiconductor pattern VSP, and the second source conductive pattern SCP2 may be spaced apart from the vertical semiconductor pattern VSP with the data storage pattern DSP interposed therebetween. The first source conductive pattern SCP1 may be spaced apart from the insulating gap-fill pattern VI with the vertical semiconductor pattern VSP interposed therebetween.

More specifically, the first source conductive pattern SCP1 may include protruding portions SCP1bt, which are located at a level lower than a top surface SCP2b of the second source conductive pattern SCP2 or higher than the top surface SCP1b of the first source conductive pattern SCP1. However, the protruding portions SCP1bt may be positioned at a level that is higher than a bottom surface SCP2a of the second source conductive pattern SCP2. For example, each of the protruding portions SCP1bt, which are in contact with the data storage pattern DSP or the lower data storage pattern DSPr, may have a curved surface.

Figure 8:
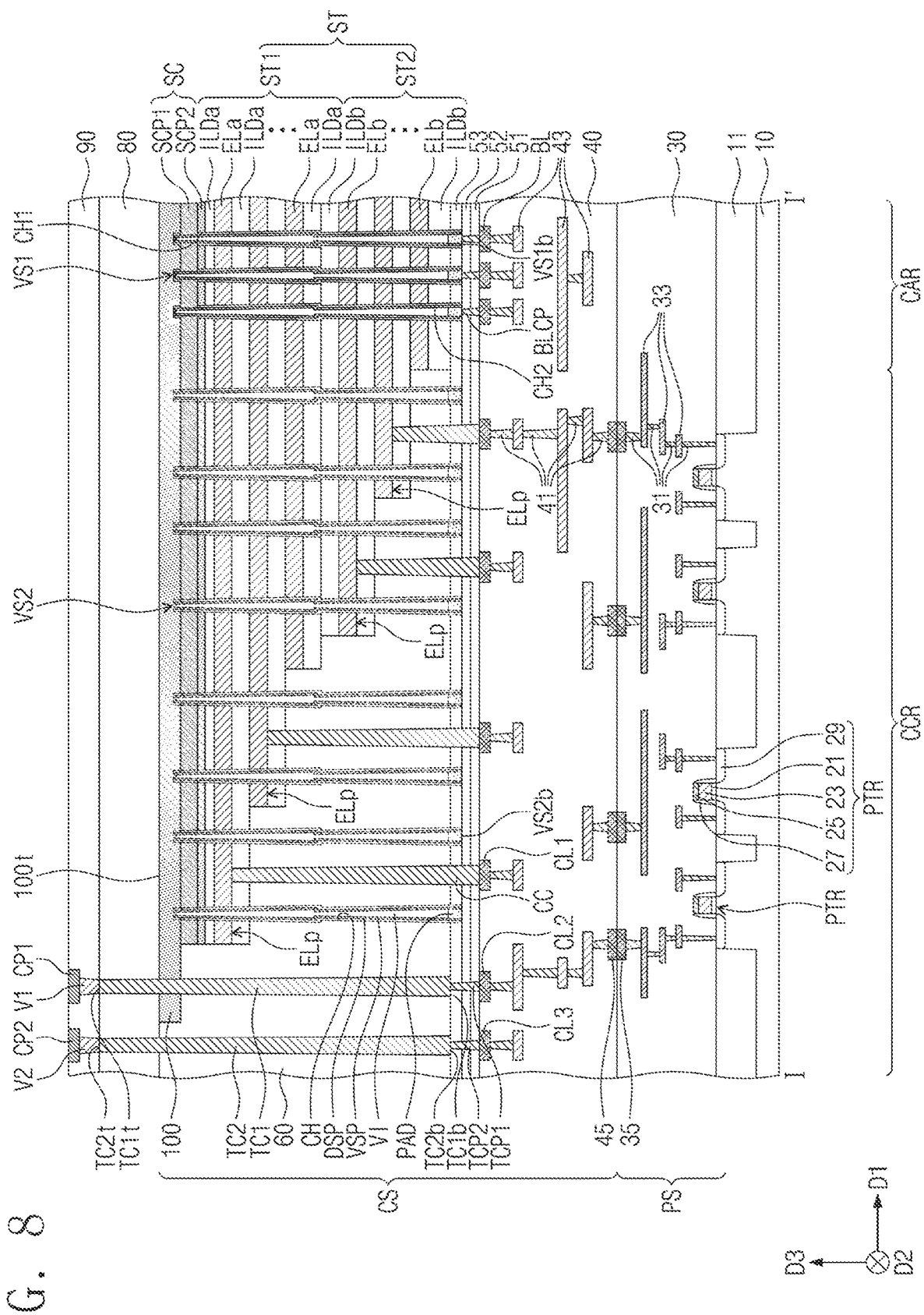
FIG. 8 is a sectional view along line I-I' of FIG. 5, according to another embodiment.

FIG. 8 is a sectional view, which is taken along line I-I' of FIG. 5 according to another embodiment. In the following description, elements previously described with reference to FIGS. 5, 6A, and 6B may be identified by the same reference numbers without repeating an overlapping description thereof, for concise description.

Referring to FIGS. 5 and 8, a first via V1 may be provided on the first penetration contact TC1, and a second via V2 may be provided on the second penetration contact TC2. The first and second vias V1 and V2 and the first and second conductive pads CP1 and CP2 may be provided in the eighth insulating layer 90.

The first via V1 may be provided between the first penetration contact TC1 and the first conductive pad CP1, and the second via V2 may be provided between the second penetration contact TC2 and the second conductive pad CP2. The first and second vias V1 and V2 may be provided such that a width in the first or second directions D1 or D2 increases in the third direction D3. The first and second vias V1 and V2 may have upper diameters, which are larger than the diameter of the first penetration contact TC1 at the level of the top surface TC1t and the diameter of the second penetration contact TC2 at the level of the top surface TC2t, respectively. The first and second vias V1 and V2 are illustrated to have lower diameters which are equal to the diameter of the first penetration contact TC1 at the level of the top surface TC1t and the diameter of the second penetration contact TC2 at the level of the top surface TC2t, but embodiments are not limited thereto.

Figure 9:
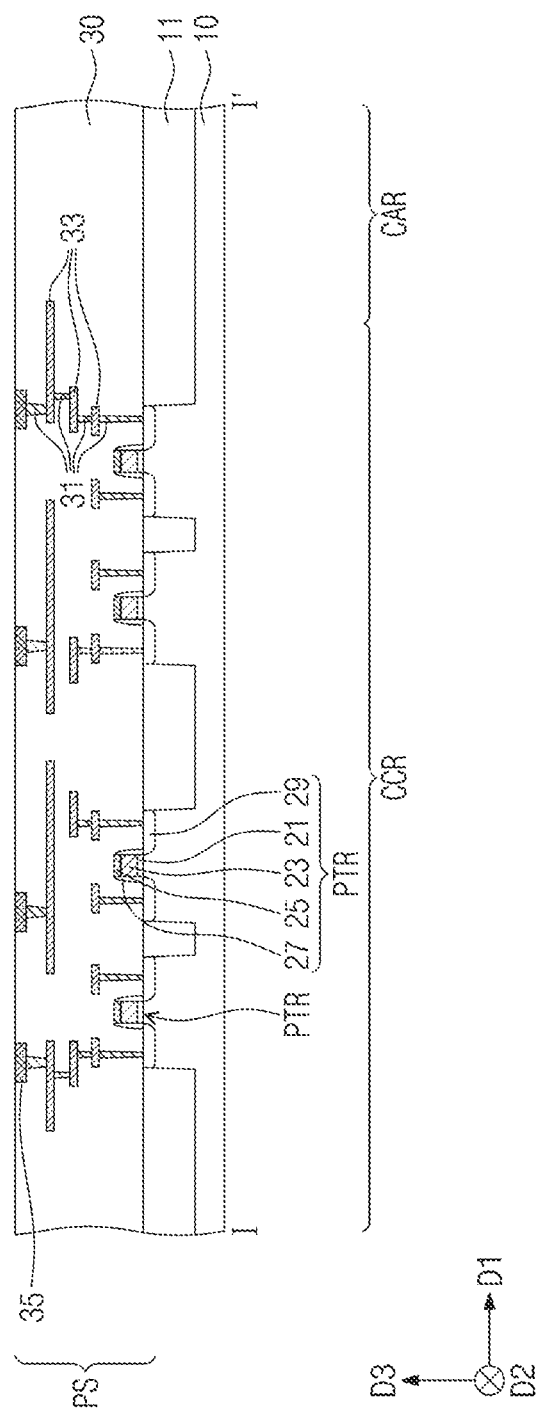
FIG. 9 is a sectional view along line I-I' of FIG. 5, illustrating a stage in a method of fabricating a three-dimensional semiconductor memory device, according to an embodiment.

FIGS. 9 to 16 are views of stages in a method of fabricating a three-dimensional semiconductor memory device, according to an embodiment. FIG. 9 is a sectional view along line I-I' of FIG. 5, FIGS. 10, 12, and 14 are plan views of stages in the method of fabricating the three-dimensional semiconductor memory device, FIGS. 11, 13, 15A, and 16 are sectional views along line III-III' of FIG. 10, 12, or 14, and FIG. 15B is a sectional view along line IV-IV' of FIG. 14. Hereinafter, the fabrication method will be described in more detail with reference to FIGS. 9 to 16.

Referring to FIG. 9, the peripheral circuit structure PS may be formed on the first substrate 10. The formation of the peripheral circuit structure PS may include forming the device isolation layer 11 in the first substrate 10, forming the peripheral transistors PTR on the active region of the first substrate 10 defined by the device isolation layer 11, forming the peripheral contact plugs 31, the peripheral circuit interconnection lines 33, and the first bonding pads 35, which are electrically connected to the peripheral transistors PTR, and forming the first insulating layer 30 to cover the peripheral contact plugs 31, the peripheral circuit interconnection lines 33, and the first bonding pads 35.

The first bonding pads 35 may be formed to have top surfaces that are substantially coplanar with a top surface of the first insulating layer 30. In the following description, the expression of "two elements are coplanar with each other" mean that a planarization process may be performed on the elements. The planarization process may be performed using, e.g., a chemical mechanical polishing (CMP) process or an etch-back process.

Figure 10:
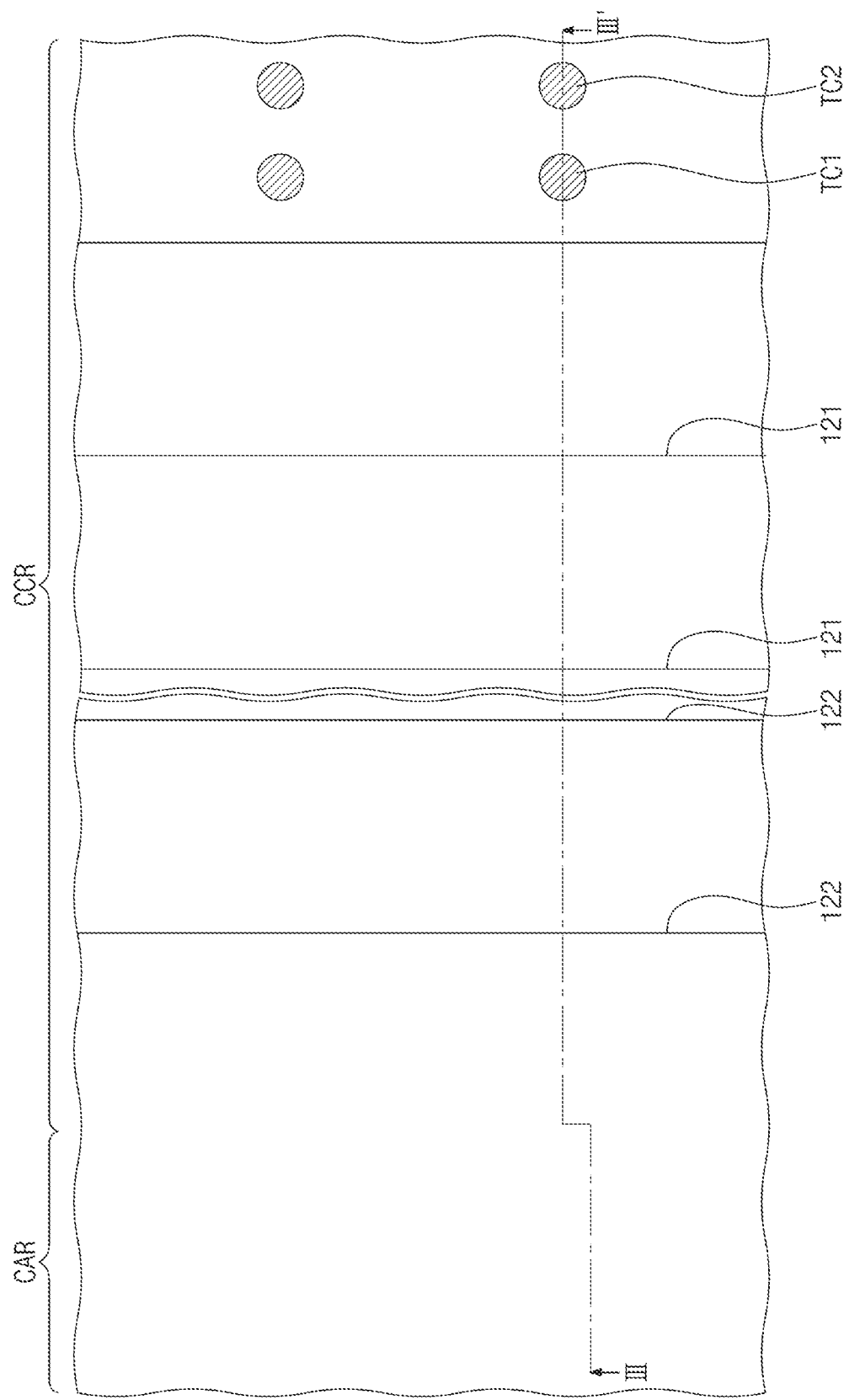
FIGS. 10, 12, and 14 are plan views of stages in a method of fabricating a three-dimensional semiconductor memory device, according to an embodiment.
Figure 11:
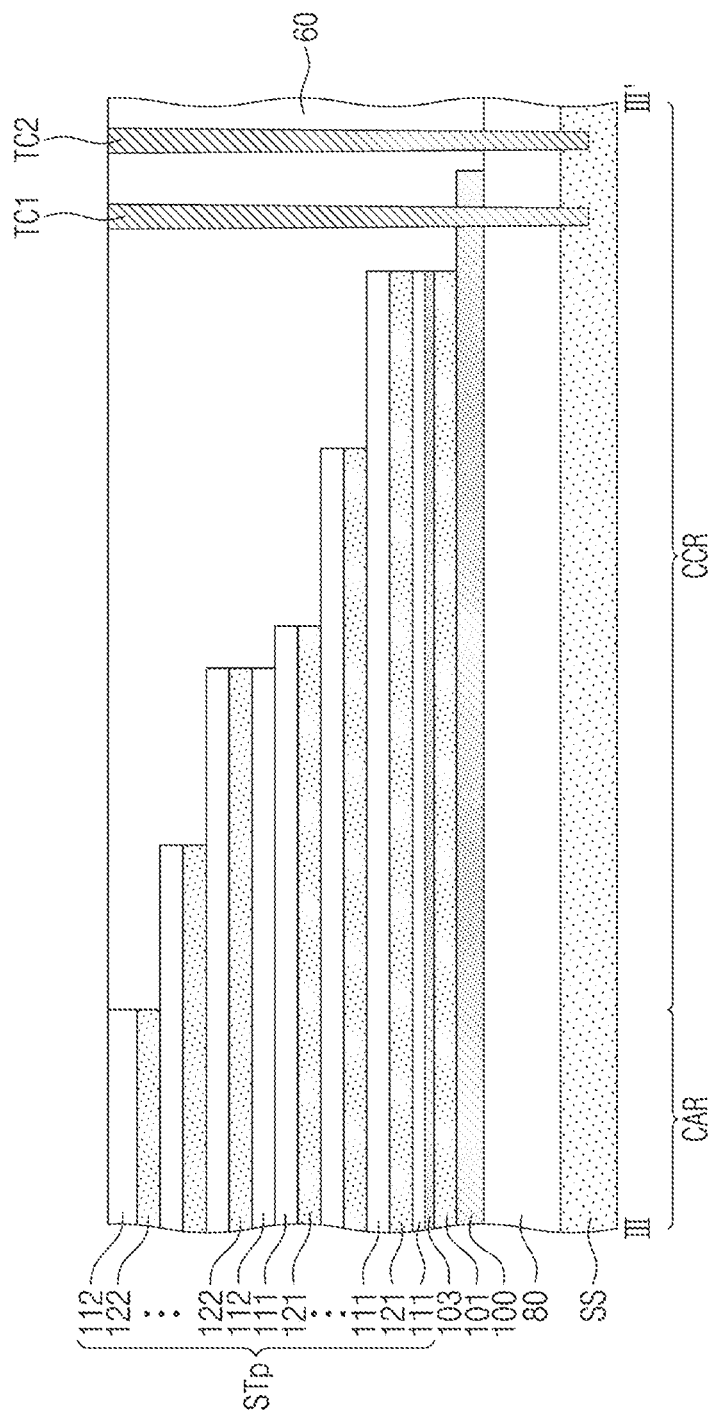
FIGS. 11, 13, 15A, and 16 are sectional views along line III-III' of FIG. 10, 12, or 14.

Referring to FIGS. 10 and 11, a sacrificial substrate SS including the cell array region CAR and the contact region CCR may be provided. The sacrificial substrate SS may be, e.g., a silicon substrate.

The seventh insulating layer 80, the second substrate 100, a lower sacrificial layer 101, and a lower semiconductor layer 103 may be sequentially formed on the sacrificial substrate SS. The second substrate 100 and the lower semiconductor layer 103 may be formed of or include at least one of doped semiconductor materials. The lower sacrificial layer 101 may be formed of or include, e.g., silicon nitride. In an embodiment, the lower sacrificial layer 101 may have a multi-layered structure including a plurality of insulating layers.

The preliminary stack structure STp may be formed on the lower semiconductor layer 103, and in an embodiment, the preliminary stack structure STp may include first and second interlayer dielectric layers 111 and 112 and first and second sacrificial layers 121 and 122, which are alternately and repeatedly stacked on the lower semiconductor layer 103. The first and second sacrificial layers 121 and 122 may be formed of or include an insulating material that is different from the first and second interlayer dielectric layers 111 and 112. The first and second sacrificial layers 121 and 122 may be formed of at least one of materials which have an etch selectivity with respect to the first and second interlayer dielectric layers 111 and 112. For example, the first and second sacrificial layers 121 and 122 may be formed of or include silicon nitride, and the first and second interlayer dielectric layers 111 and 112 may be formed of or include silicon oxide. Each of the first and second sacrificial layers 121 and 122 may have substantially the same thickness, and thicknesses of the first and second interlayer dielectric layers 111 and 112 may vary depending on their vertical position.

A trimming process may be performed on the preliminary stack structure STp including the first and second interlayer dielectric layers 111 and 112 and the first and second sacrificial layers 121 and 122. The trimming process may include forming a mask pattern on the cell array region CAR and the contact region CCR to cover a portion of a top surface of the preliminary stack structure STp, patterning the preliminary stack structure STp using the mask pattern as an etch mask, reducing an area of the mask pattern, and patterning the preliminary stack structure STp using the mask pattern having the reduced area. In an embodiment, the steps of reducing the area of the mask pattern and patterning the preliminary stack structure STp using the mask pattern may be repeated several times during the trimming process. As a result of the trimming process, each of the first and second interlayer dielectric layers 111 and 112 may be at least partially exposed to the outside, and the preliminary stack structure STp may have a staircase structure on the contact region CCR.

Hereinafter, in the following description with reference to FIGS. 10 to 16, the term 'top surface' is used to mean a 'bottom surface' in the final structure of the three-dimensional semiconductor memory device described with reference to FIGS. 6A and 6B, and the term 'bottom surface' is used to mean a 'top surface' in the final structure of the three-dimensional semiconductor memory device described with reference to FIGS. 6A and 6B.

The sixth insulating layer 60 may be formed to cover the staircase structure of the preliminary stack structure STp. The sixth insulating layer 60 may cover at least a portion of the second substrate 100 and at least a portion of the seventh insulating layer 80. The sixth insulating layer 60 may have a substantially flat top surface, which is substantially coplanar with a top surface of the uppermost one of the second interlayer dielectric layers 112 of the preliminary stack structure STp.

The first and second penetration contacts TC1 and TC2 may be formed to penetrate the sixth and seventh insulating layers 60 and 80. The first penetration contact TC1 may further penetrate the second substrate 100 between the sixth and seventh insulating layers 60 and 80. Each of the first and second penetration contacts TC1 and TC2 may further penetrate at least a portion of the sacrificial substrate SS. The formation of the first and second penetration contacts TC1 and TC2 may include forming holes to penetrate the sixth and seventh insulating layers 60 and 80 and to have a high aspect ratio and filling the holes with a conductive material. The first and second penetration contacts TC1 and TC2 may have top surfaces that are substantially coplanar with the top surface of the sixth insulating layer 60 and the top surface of the uppermost one of the second interlayer dielectric layers 112.

Figure 12:
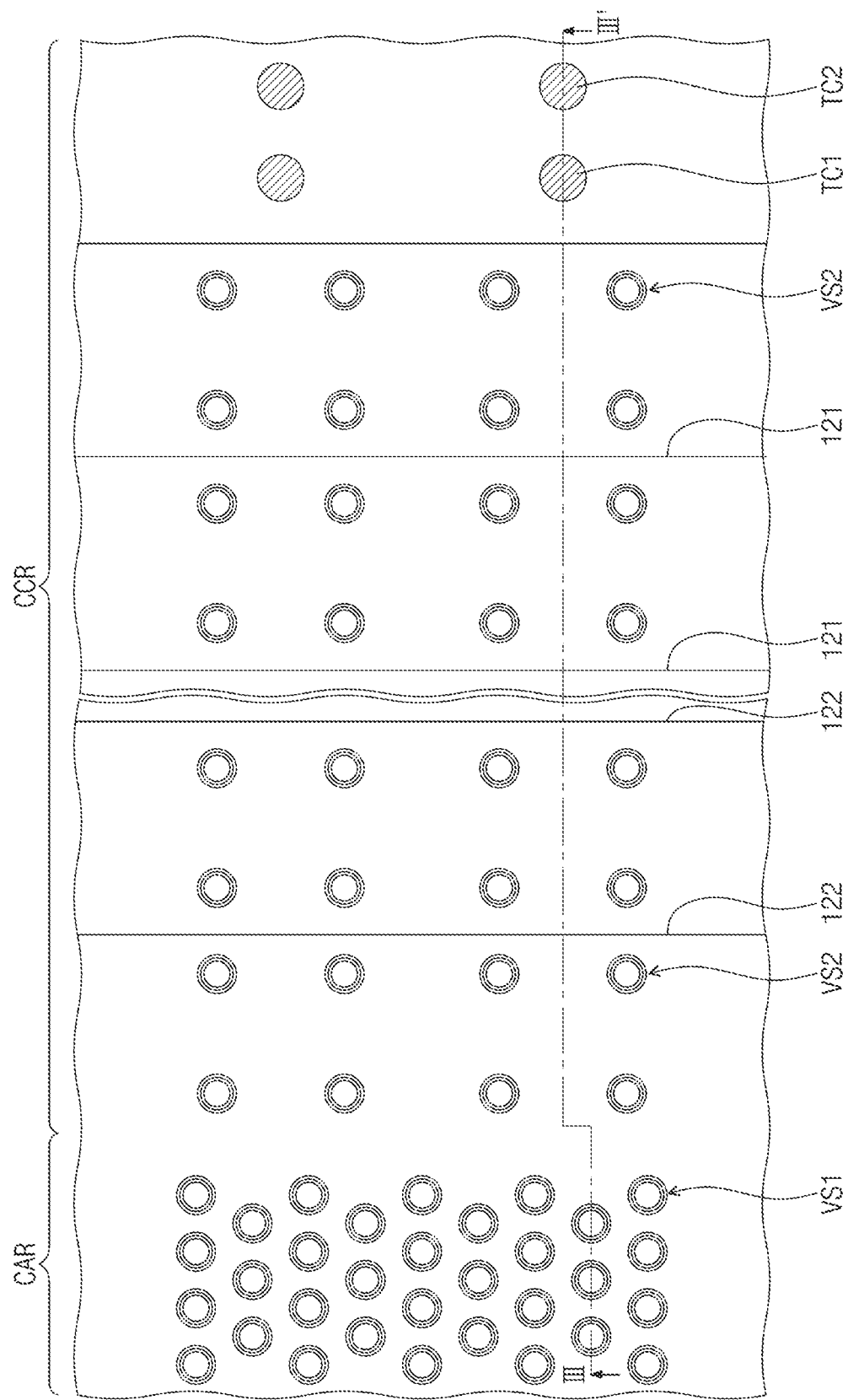
Figure 13:
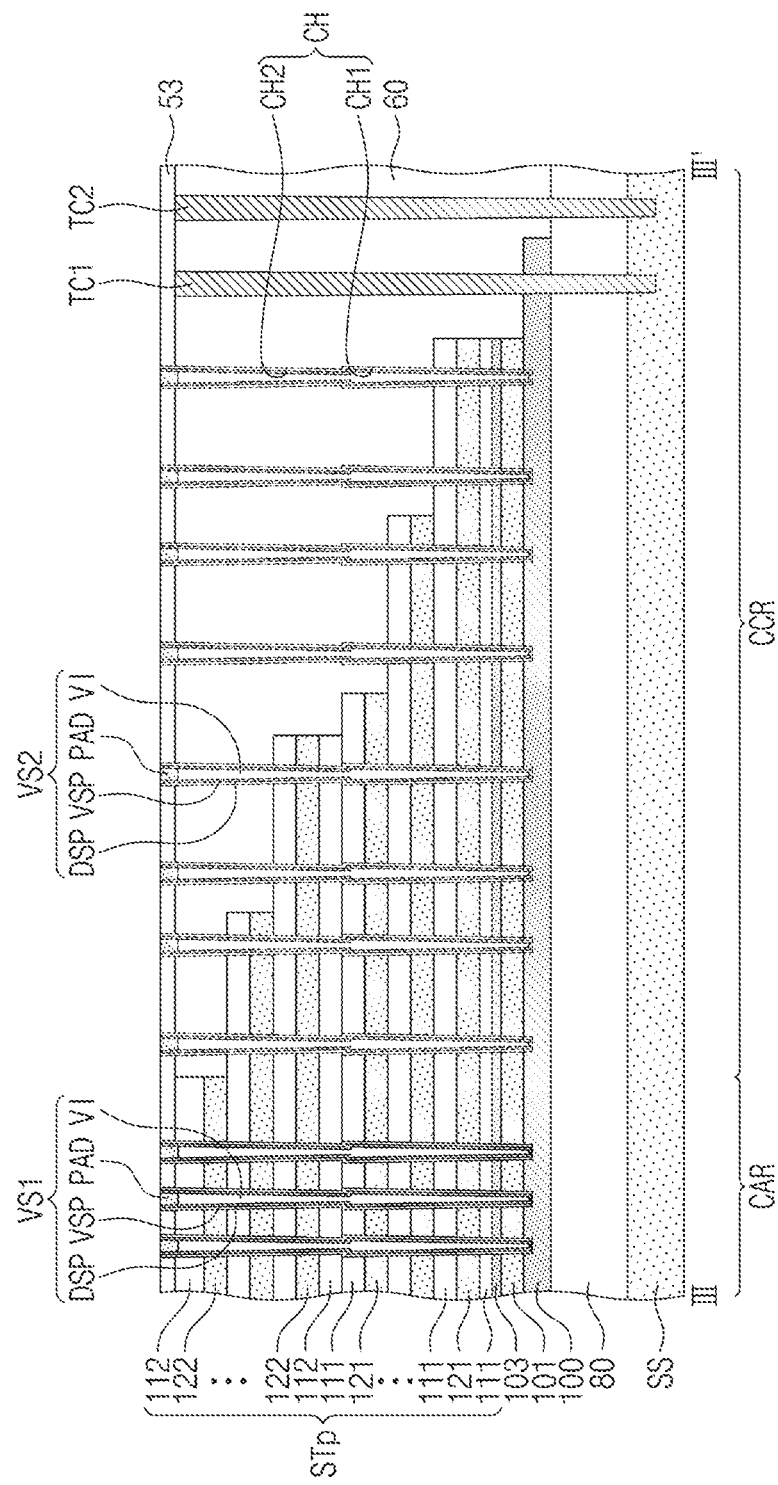

Referring to FIGS. 12 and 13, the fifth insulating layer 53 may be formed to cover the topmost surface of the preliminary stack structure STp and the top surface of the sixth insulating layer 60.

The vertical channel holes CH may be formed to penetrate the fifth insulating layer 53, the first and second interlayer dielectric layers 111 and 112, the first and second sacrificial layers 121 and 122, the lower semiconductor layer 103, and the lower sacrificial layer 101 and to have a high aspect ratio. The vertical channel holes CH may further penetrate at least a portion of the second substrate 100. The vertical channel holes CH may further penetrate the sixth insulating layer 60, on the contact region CCR.

The vertical channel holes CH may include the first vertical channel holes CH1 penetrating the first interlayer dielectric layers 111 and the first sacrificial layers 121 and the second vertical channel holes CH2 penetrating the second interlayer dielectric layers 112 and the second sacrificial layers 122. The second vertical channel holes CH2 may be overlapped with the first vertical channel holes CH1 in the third direction D3 and may be connected to the first vertical channel holes CH1.

The first vertical channel structures VS1 may be formed in the vertical channel holes CH on the cell array region CAR. The second vertical channel structures VS2 may be formed in the vertical channel holes CH on the contact region CCR.

The formation of the first and second vertical channel structures VS1 and VS2 may include forming the data storage pattern DSP and the vertical semiconductor pattern VSP to conformally cover an inner side surface of each of the vertical channel holes CH, forming the insulating gap-fill pattern VI in an empty space enclosed by the vertical semiconductor pattern VSP, and forming the conductive pad PAD in an empty space enclosed by the insulating gap-fill pattern VI and the data storage pattern DSP. The top surfaces of the first and second vertical channel structures VS1 and VS2 may be substantially coplanar with a top surface of the fifth insulating layer 53.

Figure 14:
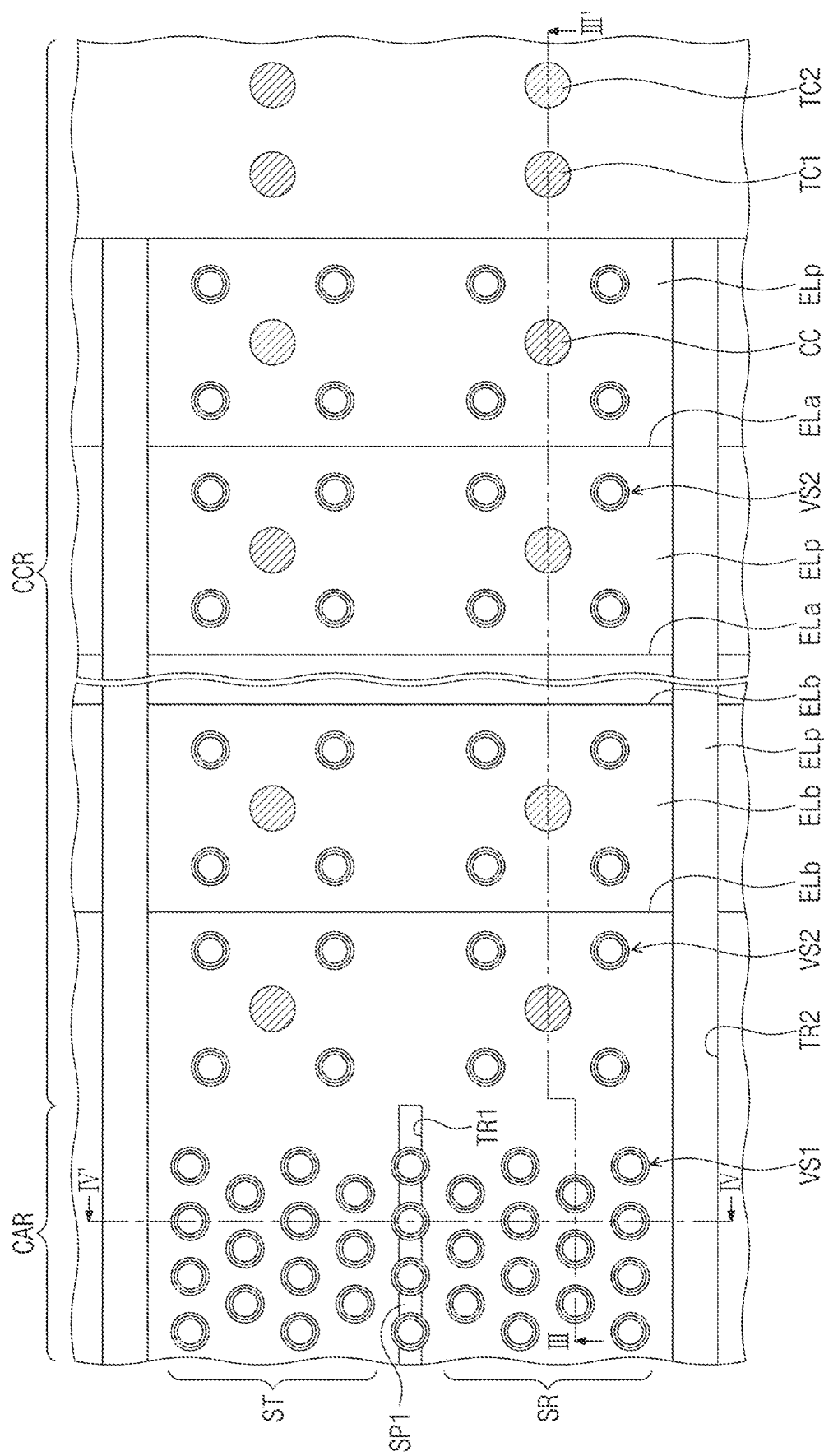
Figure 15A:
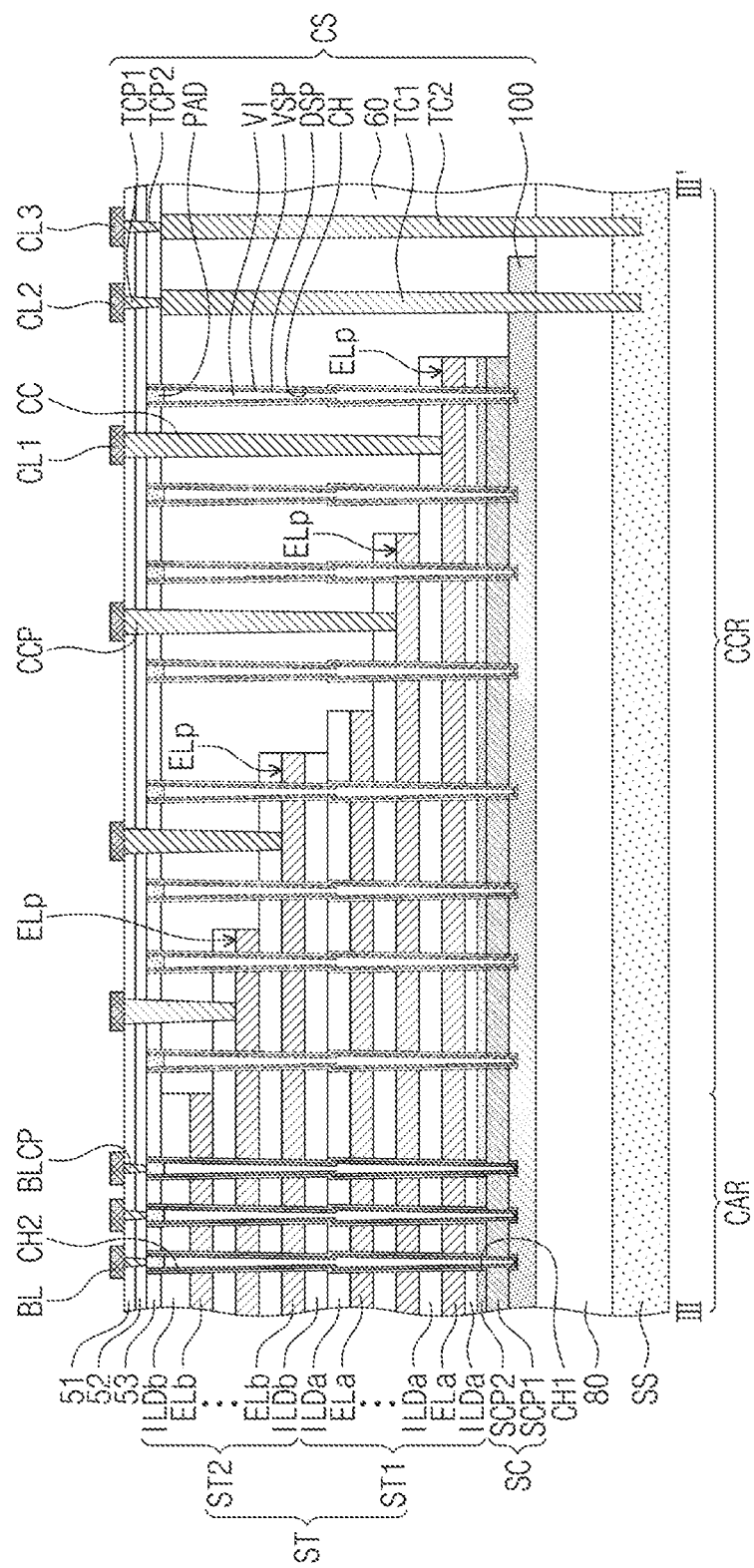
Figure 15B:
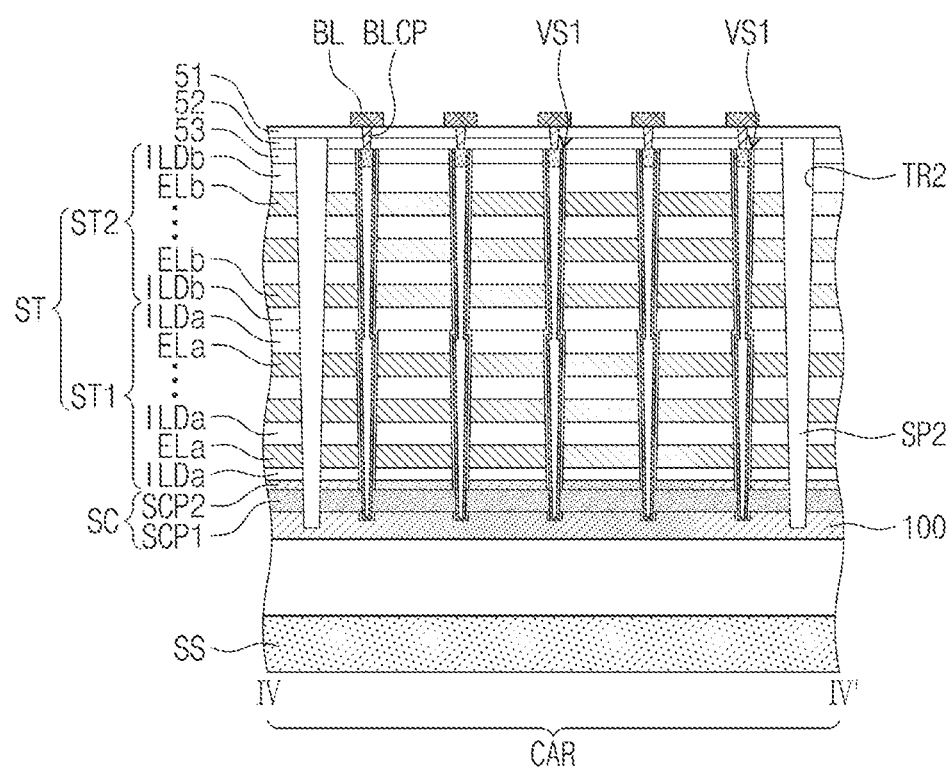
FIG. 15B is a sectional view along line IV-IV' of FIG. 14.

Referring to FIGS. 14, 15A, and 15B in conjunction with FIGS. 12 and 13, the fourth insulating layer 52 may be formed to cover the top surface of the fifth insulating layer 53 and the top surfaces of the first and second vertical channel structures VS1 and VS2.

The first trench TR1 may be formed to penetrate the fourth insulating layer 52, the fifth insulating layer 53, and the preliminary stack structure STp, and the second trenches TR2 may be formed to penetrate the fourth insulating layer 52, the fifth insulating layer 53, the preliminary stack structure STp, the lower semiconductor layer 103, and the lower sacrificial layer 101. The second trenches TR2 may further penetrate at least a portion of the second substrate 100. The second trenches TR2 may be extended from the cell array region CAR to the contact region CCR. A depth of the first trench TR1 may be smaller than a depth of each of the second trenches TR2. Although not shown, bottom surface of the first trench TR1 may be located at a level, which is higher than, e.g., the top surface of the uppermost one of the first interlayer dielectric layers 111. Bottom surfaces of the second trenches TR2 may be located at a level lower than a bottom surface of the lower sacrificial layer 101. The bottom surfaces of the second trenches TR2 may be located at a level lower than, e.g., the bottom surfaces of the first and second vertical channel structures VS1 and VS2.

The first and second sacrificial layers 121 and 122 and the lower sacrificial layer 101, which are exposed through the second trenches TR2, may be removed. The removing of the first and second sacrificial layers 121 and 122 and the lower sacrificial layer 101 may be performed through a wet etching process using hydrofluoric acid (HF) and/or phosphoric acid ($H_3PO_4$) solution.

The data storage pattern DSP of each of the first and second vertical channel structures VS1 and VS2, which are exposed through an empty space formed by removing the lower sacrificial layer 101, may be partially removed, when the lower sacrificial layer 101 is removed.

The first source conductive pattern SCP1 may be formed to fill the empty space formed by removing the lower sacrificial layer 101. The first source conductive pattern SCP1 may be in contact with the vertical semiconductor pattern VSP of each of the first and second vertical channel structures VS1 and VS2. The first source conductive pattern SCP1 may be formed of, e.g., a doped semiconductor material. Although not shown, an air gap may be formed in the first source conductive pattern SCP1. Hereinafter, the lower semiconductor layer 103 may be referred to as the second source conductive pattern SCP2, and as a result, the source structure SC including the first and second source conductive patterns SCP1 and SCP2 may be formed.

The first and second gate electrodes ELa and ELb may be formed to fill empty spaces formed by removing the first and second sacrificial layers 121 and 122. The first and second interlayer dielectric layers 111 and 112 may be referred to as the first and second interlayer dielectric layers ILDa and ILDb of the first and second stack structures ST1 and ST2, and as a result, the stack structure ST including the first and second interlayer dielectric layers ILDa and ILDb and the first and second gate electrodes ELa and ELb may be formed.

The first separation pattern SP1 may be formed to fill the first trench TR1, and the second separation patterns SP2 may be formed to fill the second trenches TR2. Top surfaces of the first and second separation patterns SP1 and SP2 may be substantially coplanar with a top surface of the fourth insulating layer 52.

The third insulating layer 51 may be formed to cover the top surface of the fourth insulating layer 52 and the top surfaces of the first and second separation patterns SP1 and SP2.

The cell contacts CC may be formed on the contact region CCR to penetrate the third to sixth insulating layers 51, 52, 53, and 60 and to be in contact with the pad portions ELp of the first and second gate electrodes ELa and ELb. The cell contacts CC may be provided to penetrate at least a portion of the first and second interlayer dielectric layers ILDa and ILDb. The cell contacts CC may have top surfaces that are substantially coplanar with a top surface of the third insulating layer 51.

The bit line contact plugs BLCP may be formed on the cell array region CAR to penetrate the third and fourth insulating layers 51 and 52 and to be in contact with the top surfaces of the first vertical channel structures VS1. The first and second penetration contact plugs TCP1 and TCP2 may be formed on the contact region CCR to penetrate the third to fifth insulating layers 51, 52, and 53 and may be connected to the first and second penetration contacts TC1 and TC2, respectively. A height of each of the first and second penetration contact plugs TCP1 and TCP2 in the third direction D3 may be larger than a height of each of the bit line contact plugs BLCP in the third direction D3.

The bit lines BL may be formed on the third insulating layer 51 to be in contact with the bit line contact plugs BLCP on the cell array region CAR. The first conductive lines CL1 may be formed on the third insulating layer 51 to be in contact with the cell contacts CC on the contact region CCR, and the second and third conductive lines CL2 and CL3 may be formed on the third insulating layer 51 to be in contact with the first and second penetration contact plugs TCP1 and TCP2, respectively, on the contact region CCR.

Figure 16:
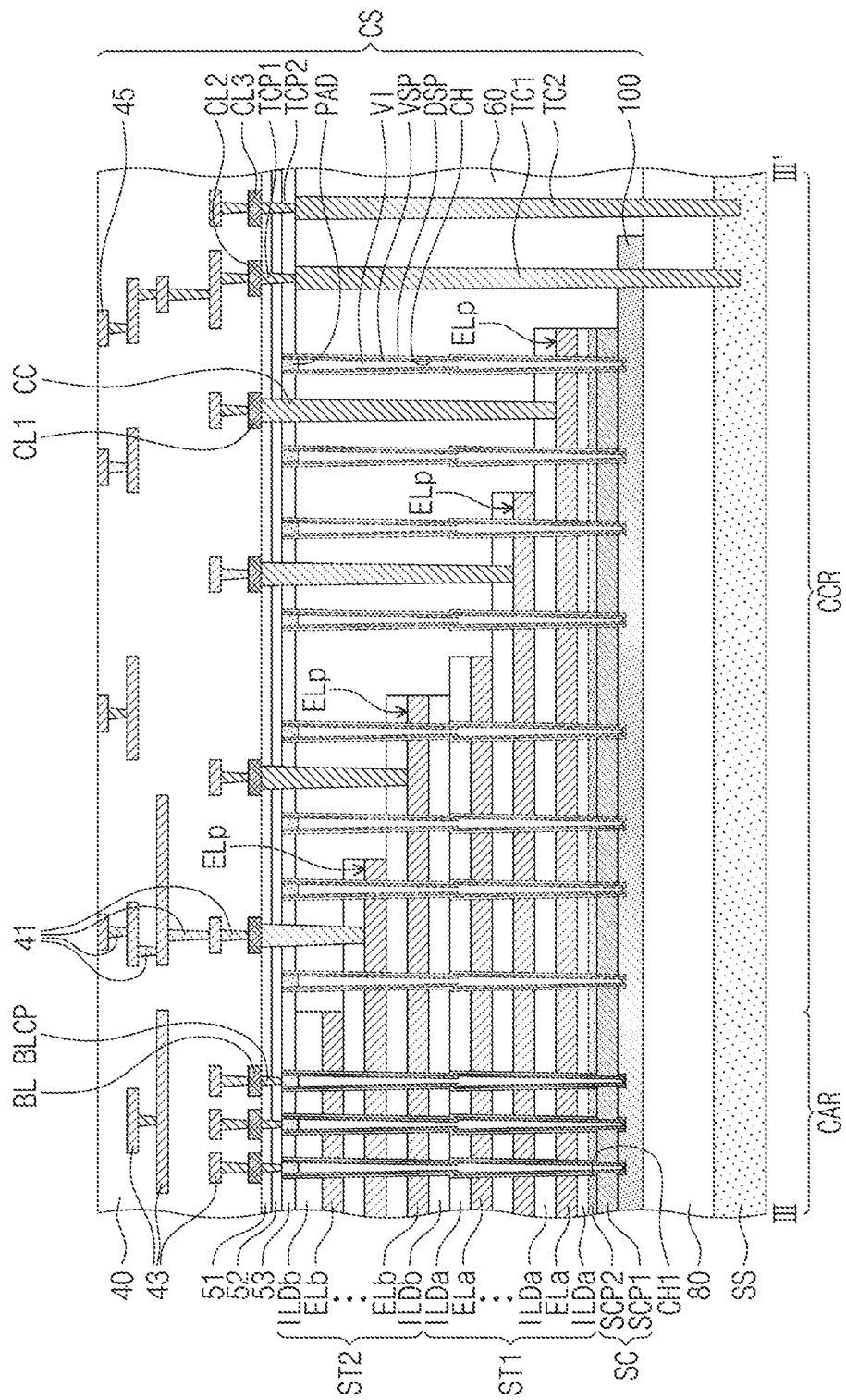

Referring to FIGS. 14 and 16, the connection contact plugs 41, the connection circuit interconnection lines 43, the second bonding pads 45, and the second insulating layer 40 covering them may be formed on the third insulating layer 51, and here, the connection contact plugs 41 may be electrically connected to the bit lines BL and the first to third conductive lines CL1, CL2, and CL3. The second bonding pads 45 may have top surfaces that are substantially coplanar with the top surface of the second insulating layer 40. As a result of the processes described with reference to FIGS. 10 to 16, the cell array structure CS may be formed on the sacrificial substrate SS.

Referring back to FIGS. 5, 6A, and 6B in conjunction with FIG. 16, the cell array structure CS formed on the sacrificial substrate SS may be coupled to the peripheral circuit structure PS formed on the first substrate 10 by the method described with reference to FIG. 9. The sacrificial substrate SS may be provided on the first substrate 10 such that the cell array structure CS and the peripheral circuit structure PS face each other. The first bonding pads 35 of the peripheral circuit structure PS and the second bonding pads 45 of the cell array structure CS may be in contact with each other and may be bonded to each other. After the bonding of the first and second bonding pads 35 and 45, the sacrificial substrate SS on the cell array structure CS may be removed.

A portion of each of the first and second penetration contacts TC1 and TC2 in the sacrificial substrate SS may be removed, during the removal of the sacrificial substrate SS. After the removal of the sacrificial substrate SS, the top surface TC1t of the first penetration contact TC1 and the top surface TC2t of the second penetration contact TC2 may be substantially coplanar with the top surface of the seventh insulating layer 80.

The first conductive pad CP1 may be formed on the top surface TC1t of the first penetration contact TC1 to be in contact with the first penetration contact TC1, and the second conductive pad CP2 may be formed on the top surface TC2t of the second penetration contact TC2 to be in contact with the second penetration contact TC2. The eighth insulating layer 90 may be formed to cover the first and second conductive pads CP1 and CP2 and the top surface of the seventh insulating layer 80.

Figure 17:
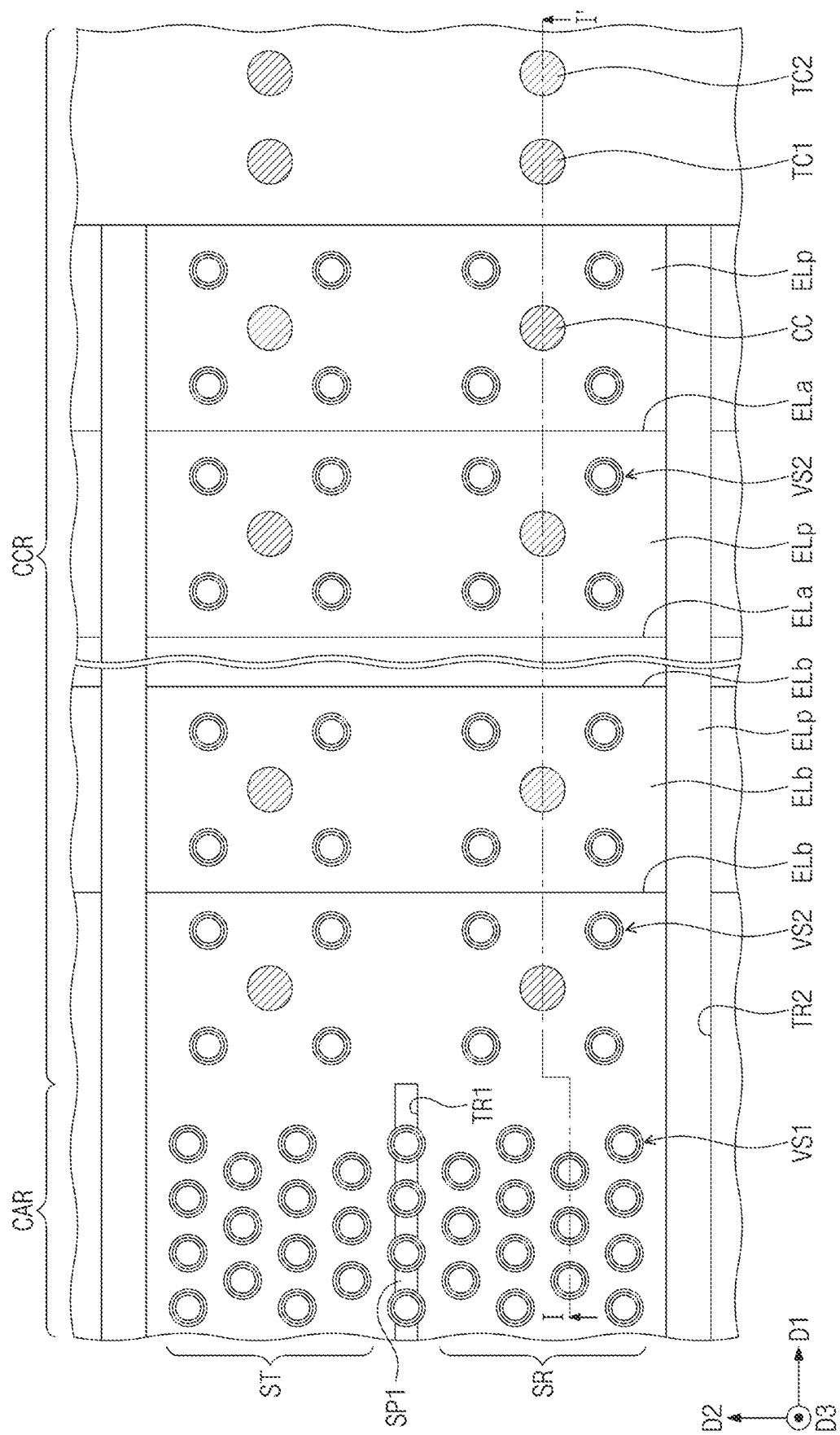
FIG. 17 is a plan view of a three-dimensional semiconductor memory device according to an embodiment.
Figure 18:
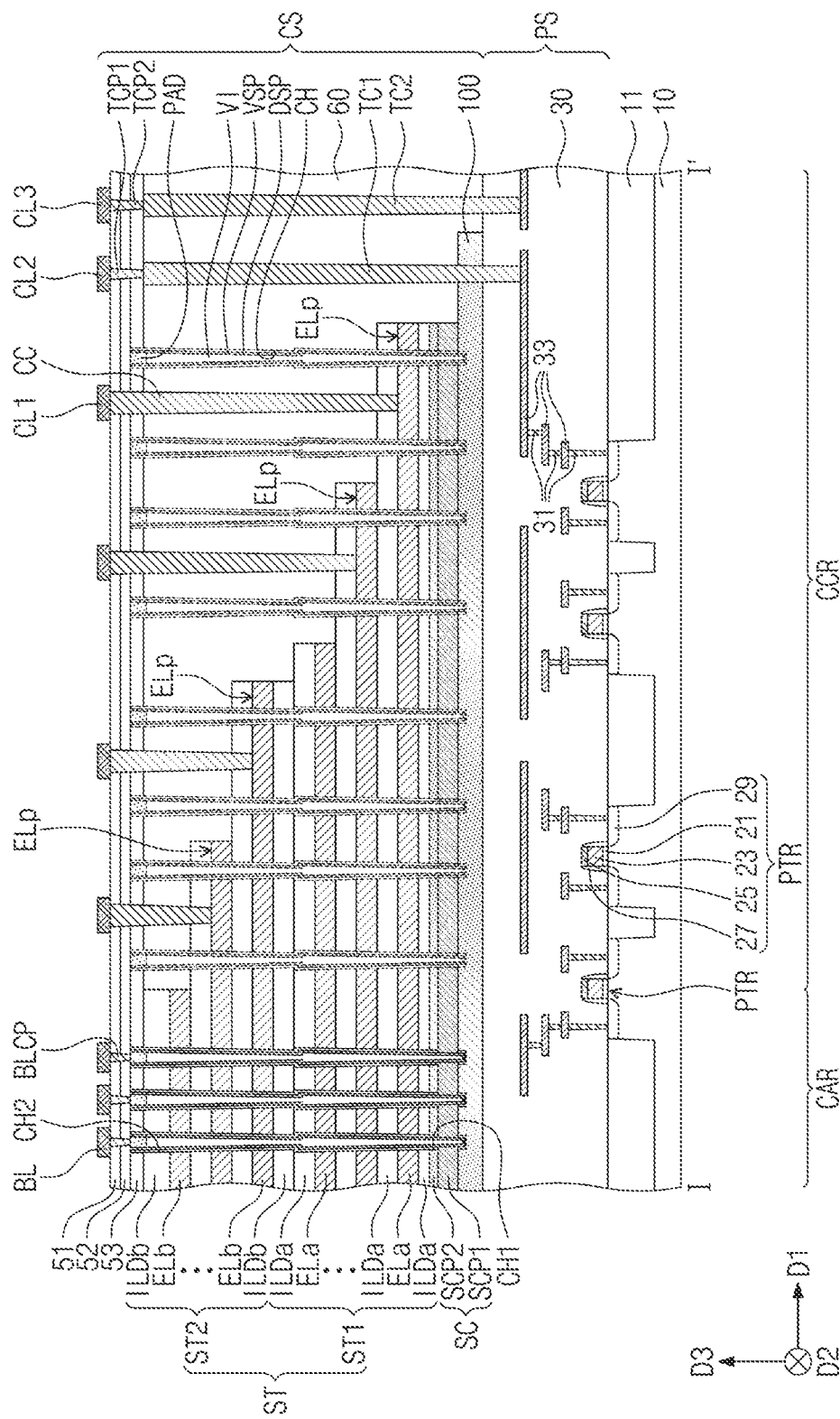
FIGS. 18 and 19 are sectional views along line I-I' of FIG. 17, according to embodiments.

FIG. 17 is a plan view illustrating a three-dimensional semiconductor memory device according to an embodiment. FIG. 18 is a sectional view, which is taken along the line I-I' of FIG. 17 to illustrate a three-dimensional semiconductor memory device according to an embodiment. In the following description, elements previously described with reference to FIGS. 5, 6A, and 6B may be identified by the same reference numbers without repeating an overlapping description thereof, for concise description.

Referring to FIGS. 17 and 18, the peripheral circuit structure PS may be provided on the first substrate 10, and the cell array structure CS including the second substrate 100, the stack structure ST, and the bit lines BL may be provided on the peripheral circuit structure PS. The second substrate 100 of the cell array structure CS may be provided on the first insulating layer 30 of the peripheral circuit structure PS, which covers the peripheral transistors PTR, the peripheral contact plugs 31, and the peripheral circuit interconnection lines 33. The second substrate 100 may be in direct contact with the first insulating layer 30. The bonding pads 35 and 45 of FIGS. 6A and 6B may not be provided between the peripheral circuit structure PS and the cell array structure CS.

The first stack structure ST1 may be provided between the second stack structure ST2 and the peripheral circuit structure PS, unlike the structure shown in FIGS. 6A and 6B. In addition, lengths, in the first direction D1, of the first and second gate electrodes ELa and ELb of the first and second stack structures ST1 and ST2 may decrease with increasing distance from the first substrate 10.

The first and second penetration contacts TC1 and TC2 may be provided to penetrate the sixth insulating layer 60 and to be in contact with some of the peripheral circuit interconnection lines 33 of the peripheral circuit structure PS and may be electrically connected to some of the peripheral transistors PTR. The first and second penetration contacts TC1 and TC2 may be provided to further penetrate at least a portion of the first insulating layer 30. The first penetration contact TC1 may be provided to penetrate the second substrate 100.

Figure 19:
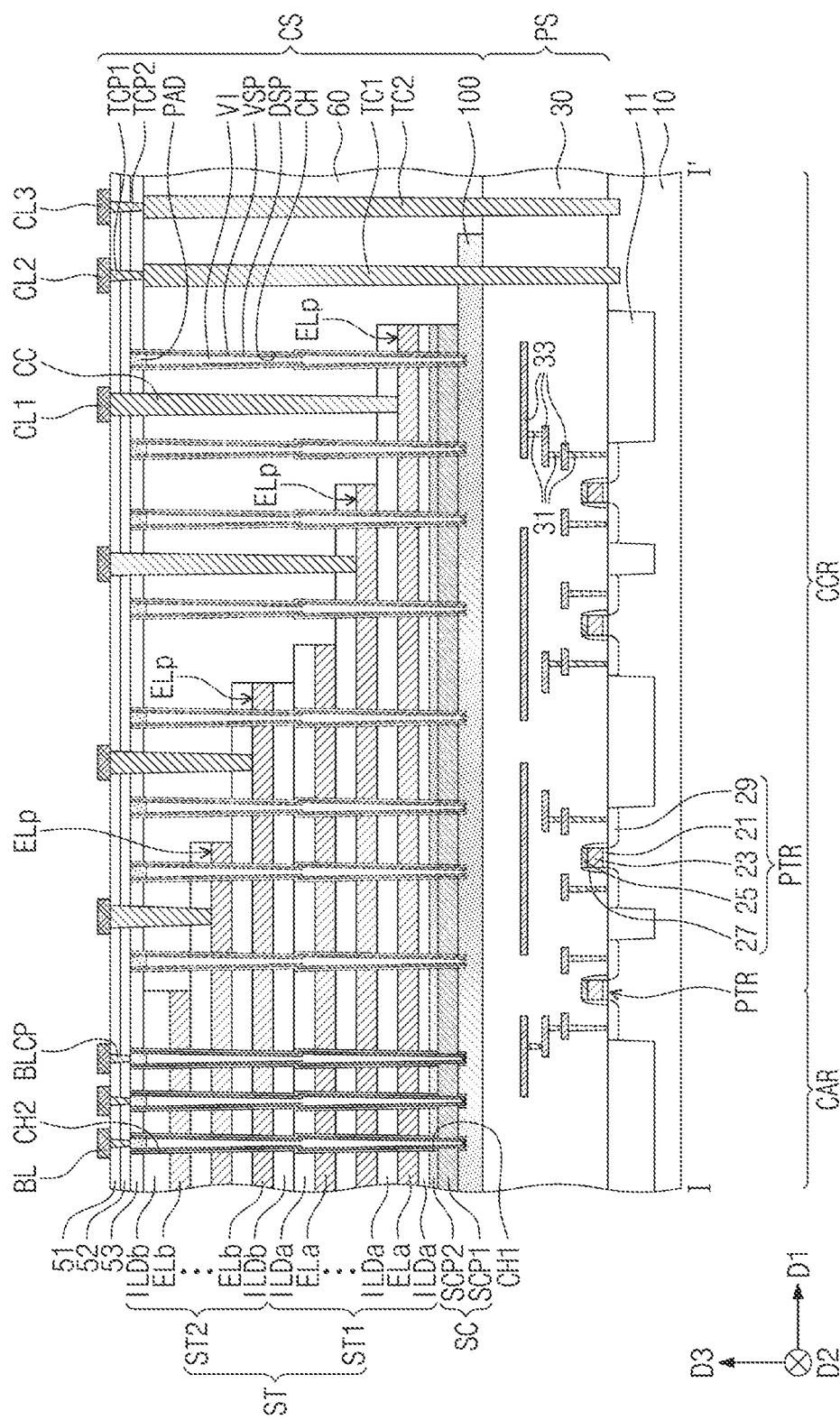

FIG. 19 is a sectional view, which is taken along the line I-I' of FIG. 17 to illustrate a three-dimensional semiconductor memory device according to an embodiment. In the following description, elements previously described with reference to FIG. 18 may be identified by the same reference numbers without repeating an overlapping description thereof, for concise description.

Referring to FIGS. 17 and 19, the first and second penetration contacts TC1 and TC2 may be provided to penetrate the sixth insulating layer 60 and the first insulating layer 30 and may be in contact with the active region of the first substrate 10 defined by the device isolation layer 11. The first and second penetration contacts TC1 and TC2 may be provided to further penetrate at least a portion of the first substrate 10.

By way of summation and review, an embodiment provides a three-dimensional semiconductor memory device with improved reliability and electric characteristics and a method of simplifying a process of fabricating the three-dimensional semiconductor memory device. An embodiment also provides an electronic system including the three-dimensional semiconductor memory device.

That is, according to an embodiment, a three-dimensional semiconductor memory device may include a first substrate, a peripheral circuit structure including peripheral transistors on the first substrate, and a cell array structure coupled to the peripheral circuit structure through bonding pads, and here, the cell array structure may include a stack structure and a second substrate on the stack structure. According to an embodiment, the second substrate may be grounded through a penetration contact penetrating the second substrate, without a bypass via provided on the second substrate, and thus, it may be possible to prevent or suppress an arcing phenomenon, in which electric charges are accumulated in a portion of the second substrate. Accordingly, the reliability and electric characteristics of the three-dimensional semiconductor memory device may be improved. In addition, it may be possible to omit an additional process of forming the bypass via on the second substrate and to simplify the fabrication process.

Furthermore, the three-dimensional semiconductor memory device according to an embodiment may have an increased cell capacity per unit area because the cell array structure is provided on and coupled to the peripheral circuit structure. The peripheral circuit structure and the cell array structure may be separately fabricated and then may be coupled to each other, and in this case, it may be possible to prevent the peripheral transistors from being damaged by several thermal treatment processes. Accordingly, the reliability and electric characteristics of the three-dimensional semiconductor memory device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:
   a first substrate;
   a peripheral circuit structure on the first substrate;
   a cell array structure on the peripheral circuit structure, the cell array structure including:
      a stack structure, the stack structure including interlayer dielectric layers and gate electrodes, which are alternately and repeatedly stacked on the peripheral circuit structure,
      a first insulating layer covering the stack structure, and
      a second substrate on the stack structure and the first insulating layer, the stack structure being between a bottom surface of the second substrate and the peripheral circuit structure;
   a second insulating layer on the cell array structure;
   a first penetration contact penetrating the first insulating layer, the second substrate, and the second insulating layer; and
   a second penetration contact penetrating the first insulating layer and the second insulating layer, the second penetration contact being spaced apart from the second substrate, and both the first and second penetration contacts having widths decreasing with an increasing distance from the first substrate.

2. The device as claimed in claim 1, wherein:
   the cell array structure further includes:
      cell contacts penetrating the first insulating layer, the cell contacts having top surfaces in contact with the gate electrodes of the stack structure; and
      vertical channel structures penetrating the stack structure, the vertical channel structures having top surfaces in contact with the second substrate, and
   bottom surfaces of the first penetration contact and the second penetration contact are at a level that is different from bottom surfaces of the cell contacts and bottom surfaces of the vertical channel structures.

3. The device as claimed in claim 2, wherein the bottom surfaces of the first penetration contact and the second penetration contact are at a level that is higher than the bottom surfaces of the cell contacts and the bottom surfaces of the vertical channel structures.

4. The device as claimed in claim 1, wherein top surfaces of the first penetration contact and the second penetration contact are at a level that is higher than a top surface of the second substrate.

5. The device as claimed in claim 1, further comprising a first conductive pad and a second conductive pad on the second insulating layer, the first conductive pad and the second conductive pad being connected to the first penetration contact and the second penetration contact, respectively.

6. The device as claimed in claim 5, further comprising:
   a first via between the first penetration contact and the first conductive pad; and
   a second via between the second penetration contact and the second conductive pad, the first via and the second via being at a level that is higher than a top surface of the second substrate, and the first via and the second via having widths increasing with the increasing distance from the first substrate.

7. The device as claimed in claim 1, wherein the first penetration contact is spaced apart from the stack structure, a side surface of the first penetration contact being in direct contact with the second substrate.

8. The device as claimed in claim 1, wherein:
the peripheral circuit structure includes peripheral transistors on the first substrate and first bonding pads connected to the peripheral transistors, and
the cell array structure further includes:
cell contacts penetrating the first insulating layer and having top surfaces in contact with the gate electrodes of the stack structure,
vertical channel structures penetrating the stack structure and having top surfaces in contact with the second substrate,
conductive lines connected to the cell contacts and the first and second penetration contacts,
bit lines connected to the vertical channel structures, and
second bonding pads connected to the bit lines and the conductive lines, each of the first bonding pads of the peripheral circuit structure being integrally bonded to each of the second bonding pads of the cell array structure being.

9. The device as claimed in claim 8, wherein the cell contacts and the vertical channel structures have widths decreasing with the increasing distance from the first substrate.

10. The device as claimed in claim 1, wherein the gate electrodes have lengths increasing with the increasing distance from the first substrate.

11. A three-dimensional semiconductor memory device, comprising:
a first substrate;
a peripheral circuit structure on the first substrate;
a cell array structure on the peripheral circuit structure;
a first insulating layer on the cell array structure;
a first penetration contact penetrating the cell array structure and the first insulating layer; and
a second penetration contact penetrating the cell array structure and the first insulating layer,
wherein the peripheral circuit structure includes:
peripheral transistors on the first substrate;
peripheral circuit interconnection lines on the peripheral transistors; and
first bonding pads connected to the peripheral transistors through the peripheral circuit interconnection lines,
wherein the cell array structure includes:
second bonding pads, each of which is integrally bonded to each of the first bonding pads of the peripheral circuit structure;
connection circuit interconnection lines on the second bonding pads;
bit lines connected to the second bonding pads through the connection circuit interconnection lines;
a stack structure including interlayer dielectric layers and gate electrodes, which are alternately and repeatedly stacked on the bit lines;
a second insulating layer covering the stack structure;
vertical channel structures penetrating the stack structure and connected to the bit lines; and
a second substrate on the stack structure and the second insulating layer to be in contact with a top surface of each of the vertical channel structures,
wherein the stack structure is between a bottom surface of the second substrate and the peripheral circuit structure,
wherein the vertical channel structures are in vertical channel holes penetrating the stack structure,
wherein each of the vertical channel structures includes a data storage pattern, which conformally covers an inner side surface of each of the vertical channel holes, and a vertical semiconductor pattern, which is enclosed by the data storage pattern,
wherein the data storage pattern includes a blocking insulating layer, a charge storing layer, and a tunneling insulating layer, which are sequentially stacked,
wherein the first penetration contact penetrates the second substrate,
wherein the second penetration contact is spaced apart from the second substrate, and
wherein the first penetration contact and the second penetration contact have widths decreasing with an increasing distance from the first substrate.

12. The device as claimed in claim 11, wherein:
the vertical channel structures have widths decreasing with the increasing distance from the first substrate, and
the gate electrodes have lengths increasing with the increasing distance from the first substrate.

13. The device as claimed in claim 11, wherein the first and second bonding pads include copper (Cu).

14. The device as claimed in claim 11, wherein:
each of the vertical channel holes includes a first vertical channel hole and a second vertical channel hole connected to the first vertical channel hole, and
the first vertical channel hole and the second vertical channel hole have different diameters from each other at a boundary therebetween.

15. The device as claimed in claim 11, further comprising a separation pattern crossing a region between a plurality of the stack structure, the separation pattern being in contact with side surfaces of the interlayer dielectric layers and the gate electrodes,
wherein the separation pattern has a top surface in contact with the second substrate, the separation pattern including an insulating material.

16. The device as claimed in claim 15, wherein bottom surfaces of the first and second penetration contacts are at a level that is different from a bottom surface of the separation pattern and bottom surfaces of the vertical channel structures.

17. The device as claimed in claim 11, wherein top surfaces of the first and second penetration contacts are at a level that is higher than a top surface of the second substrate.

18. The device as claimed in claim 11, wherein:
the cell array structure further includes a source conductive pattern between the stack structure and the second substrate,
an impurity concentration of the source conductive pattern is different from an impurity concentration of the second substrate,
the source conductive pattern is in contact with the vertical semiconductor pattern of each of the vertical channel structures, and
the first penetration contact is spaced apart from the source conductive pattern.

19. An electronic system, comprising:
a three-dimensional semiconductor memory device including a first substrate, a peripheral circuit structure on the first substrate, a cell array structure on the peripheral circuit structure, a first insulating layer on the cell array structure, a first penetration contact and a second penetration contact penetrating the cell array structure and the first insulating layer, and an input/output pad on the second penetration contact; and
a controller electrically connected to the three-dimensional semiconductor memory device through the input/output pad and configured to control the three-dimensional semiconductor memory device, wherein the cell array structure includes:
- a stack structure including interlayer dielectric layers and gate electrodes, which are alternately and repeatedly stacked on the peripheral circuit structure; and
- a second substrate on the stack structure, wherein the stack structure is between the peripheral circuit structure and the second substrate, wherein the first penetration contact penetrates the second substrate, wherein the second penetration contact is spaced apart from the second substrate, and wherein the first and second penetration contacts have width decreasing with an increasing distance from the first substrate.

20. The electronic system as claimed in claim 19, wherein:

the peripheral circuit structure includes peripheral transistors on the first substrate, and first bonding pads connected to the peripheral transistors, the cell array structure further includes:
- a second insulating layer covering the stack structure;
- cell contacts penetrating the second insulating layer to be in contact with the gate electrodes of the stack structure;
- vertical channel structures penetrating the stack structure to be in contact with the second substrate;
- conductive lines connected to the cell contacts and the first and second penetration contacts;
- bit lines connected to the vertical channel structures; and
- second bonding pads connected to the bit lines and the conductive lines, each of the first bonding pads being integrally bonded to each of the second bonding pads.

* * * * *